(12) United States Patent
Sugimoto

(10) Patent No.: US 10,071,392 B2
(45) Date of Patent: Sep. 11, 2018

(54) FLEXIBLE-ELECTRONIC-DEVICE MANUFACTURING APPARATUS

(71) Applicant: KOMORI CORPORATION, Tokyo (JP)

(72) Inventor: Ikuo Sugimoto, Tokyo (JP)

(73) Assignee: KOMORI CORPORATION, Tokyo (JP)

(*) Notice: Subject to any disclaimer, the term of this patent is extended or adjusted under 35 U.S.C. 154(b) by 0 days.

(21) Appl. No.: 14/612,537

(22) Filed: Feb. 3, 2015

(65) Prior Publication Data

US 2015/0224530 A1   Aug. 13, 2015

(30) Foreign Application Priority Data

Feb. 12, 2014   (JP) .................. 2014-024023

(51) Int. Cl.
  *B41F 19/00* (2006.01)
  *B05C 1/08* (2006.01)
  (Continued)

(52) U.S. Cl.
  CPC .......... *B05C 1/0873* (2013.01); *B05C 1/0808* (2013.01); *B05C 1/0834* (2013.01); *B05C 1/16* (2013.01); *B05C 13/02* (2013.01); *B41F 13/0045* (2013.01); *B41F 13/24* (2013.01); *B41F 19/001* (2013.01); *B41F 19/005* (2013.01); *B41F 19/007* (2013.01); *B41F 21/05* (2013.01); *B41F 21/10* (2013.01); *B41F 23/0453* (2013.01); *B41F 23/0456* (2013.01);
  (Continued)

(58) Field of Classification Search
  CPC ... B41F 19/005; B41F 19/007; H05K 3/1275; B41M 3/008
  See application file for complete search history.

(56) References Cited

U.S. PATENT DOCUMENTS 4,647,033 A * 3/1987 Emrich .................. B65H 5/24
                                              271/197
4,669,380 A * 6/1987 Seib .................... B41F 33/0018
                                              101/216
(Continued)

FOREIGN PATENT DOCUMENTS

CN    101297416 A    10/2008
EP    1 713 311 A2   10/2006
(Continued)

*Primary Examiner* — Justin Olamit
(74) *Attorney, Agent, or Firm* — Birch, Stewart, Kolasch & Birch, LLP

(57) ABSTRACT

A flexible-electronic-device manufacturing apparatus for manufacturing an electronic device including a flexible base material and a plurality of functional layers provided thereon includes: an impression cylinder configured to hold and transport the base material; impression-cylinder driving means for rotating the impression cylinder; processing means for performing a plurality of processes for providing the plurality of functional layers by a printing method or a coating applying method on the base material held on the impression cylinder; impression-cylinder phase detecting means for detecting the phase of the impression cylinder; and controlling means for controlling the impression-cylinder driving means and the processing means based on the result of detection by the impression-cylinder phase detecting means.

9 Claims, 19 Drawing Sheets

(51) Int. Cl.
  *B05C 13/02* (2006.01)
  *B05C 1/16* (2006.01)
  *B41F 23/04* (2006.01)
  *B41F 33/00* (2006.01)
  *B41F 33/02* (2006.01)
  *B41F 33/10* (2006.01)
  *B41F 13/004* (2006.01)
  *B41F 13/24* (2006.01)
  *B41F 21/05* (2006.01)
  *B41F 21/10* (2006.01)
  *H01L 29/786* (2006.01)
  *H01L 27/12* (2006.01)
  *H05K 3/12* (2006.01)

(52) U.S. Cl.
  CPC ...... *B41F 33/0009* (2013.01); *B41F 33/0081* (2013.01); *B41F 33/02* (2013.01); *B41F 33/10* (2013.01); *H01L 27/1292* (2013.01); *H01L 29/78603* (2013.01); *H05K 3/1275* (2013.01); *H05K 2203/0143* (2013.01)

(56) References Cited

U.S. PATENT DOCUMENTS

| | | | |
|---|---|---|---|
| 4,936,211 A * | 6/1990 | Pensavecchia | B41F 13/0008 101/136 |
| 5,588,362 A * | 12/1996 | Sugiyama | B41F 13/28 101/185 |
| 5,822,345 A * | 10/1998 | Sousa | B41C 1/1033 372/25 |
| 5,836,246 A | 11/1998 | Saito et al. | |
| 6,581,517 B1 * | 6/2003 | Becker | B41F 13/18 101/389.1 |
| 8,196,924 B2 * | 6/2012 | Numauchi | B41F 13/0045 271/265.02 |
| 8,375,854 B2 * | 2/2013 | Saito | B41F 13/24 101/184 |
| 9,233,530 B2 | 1/2016 | Ishiwata et al. | |
| 2005/0155503 A1 | 7/2005 | Onuma et al. | |
| 2007/0068404 A1 | 3/2007 | Hirahara et al. | |
| 2008/0236421 A1 * | 10/2008 | Ito | B41F 31/00 101/217 |
| 2011/0203469 A1 * | 8/2011 | Deis | B41F 13/10 101/415.1 |
| 2015/0096454 A1 | 4/2015 | Sugiyama | |
| 2015/0183206 A1 * | 7/2015 | Frankenberg | B41F 33/0081 101/483 |

FOREIGN PATENT DOCUMENTS

| | | |
|---|---|---|
| EP | 2 506 330 A1 | 10/2012 |
| JP | 58-197054 A | 11/1983 |
| JP | 04-323044 A * | 11/1992 |
| JP | 9-123395 A | 5/1997 |
| JP | 2001-239641 A | 9/2001 |
| JP | 2005-205630 A | 8/2005 |
| JP | 2007-268715 A | 10/2007 |
| JP | 2012-44109 A | 3/2012 |
| WO | WO 2006/081511 A2 | 8/2006 |
| WO | WO 2013/011788 A1 | 1/2013 |
| WO | WO 2013/161649 A1 | 10/2013 |

* cited by examiner

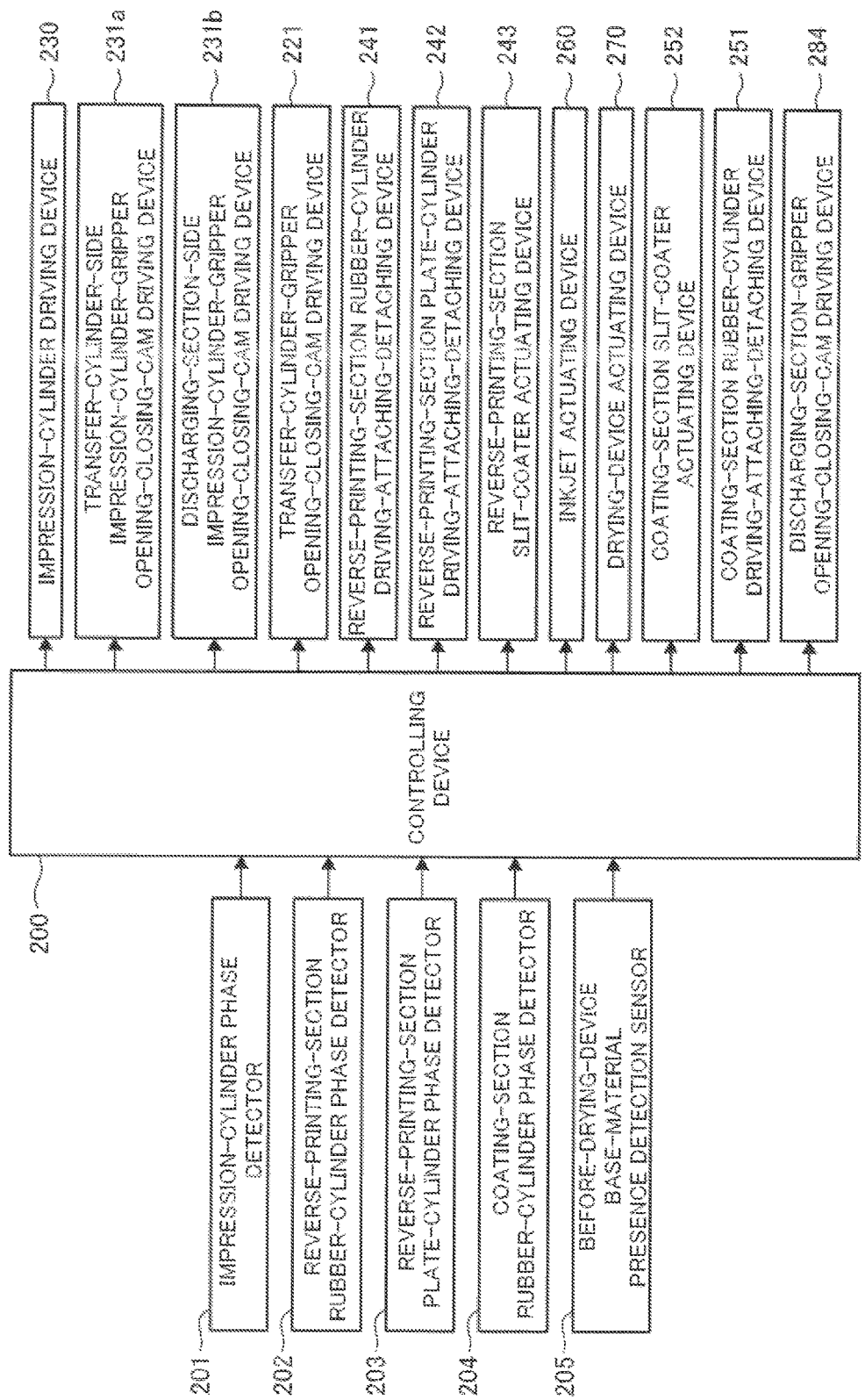

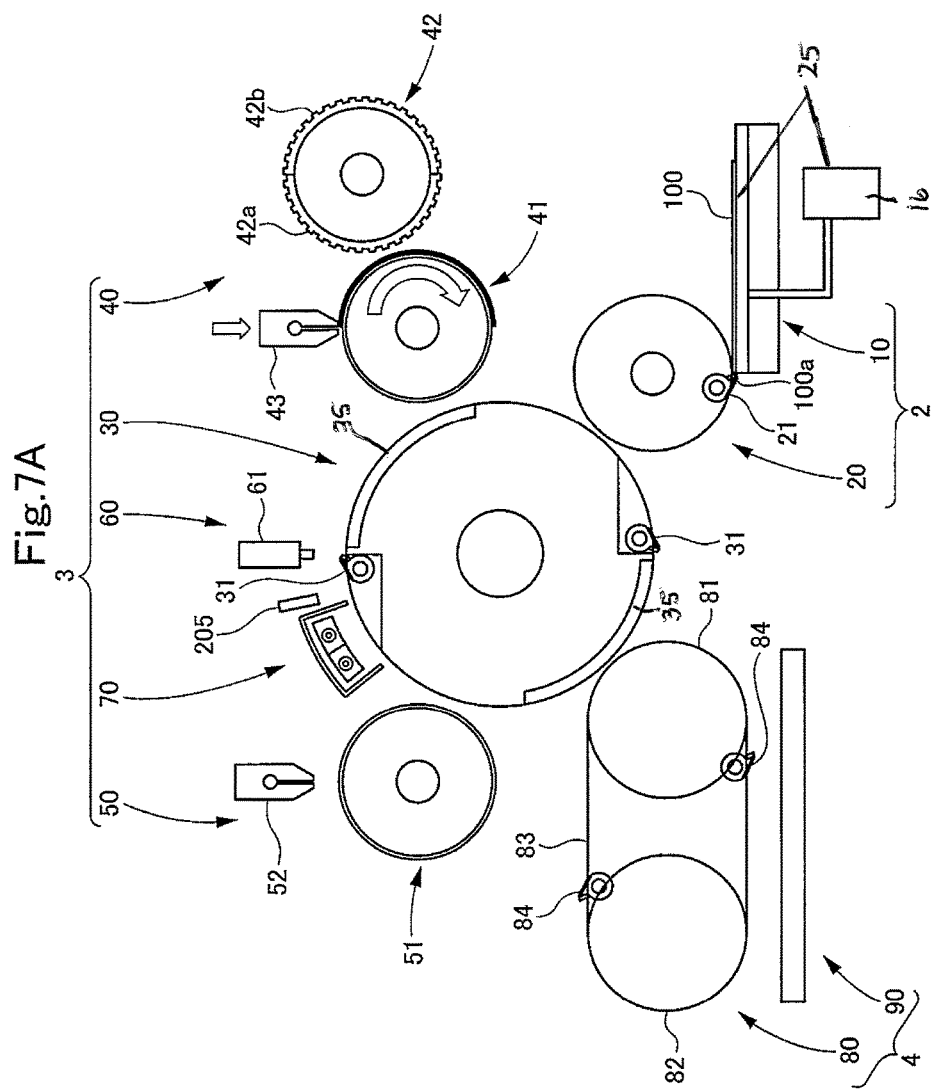

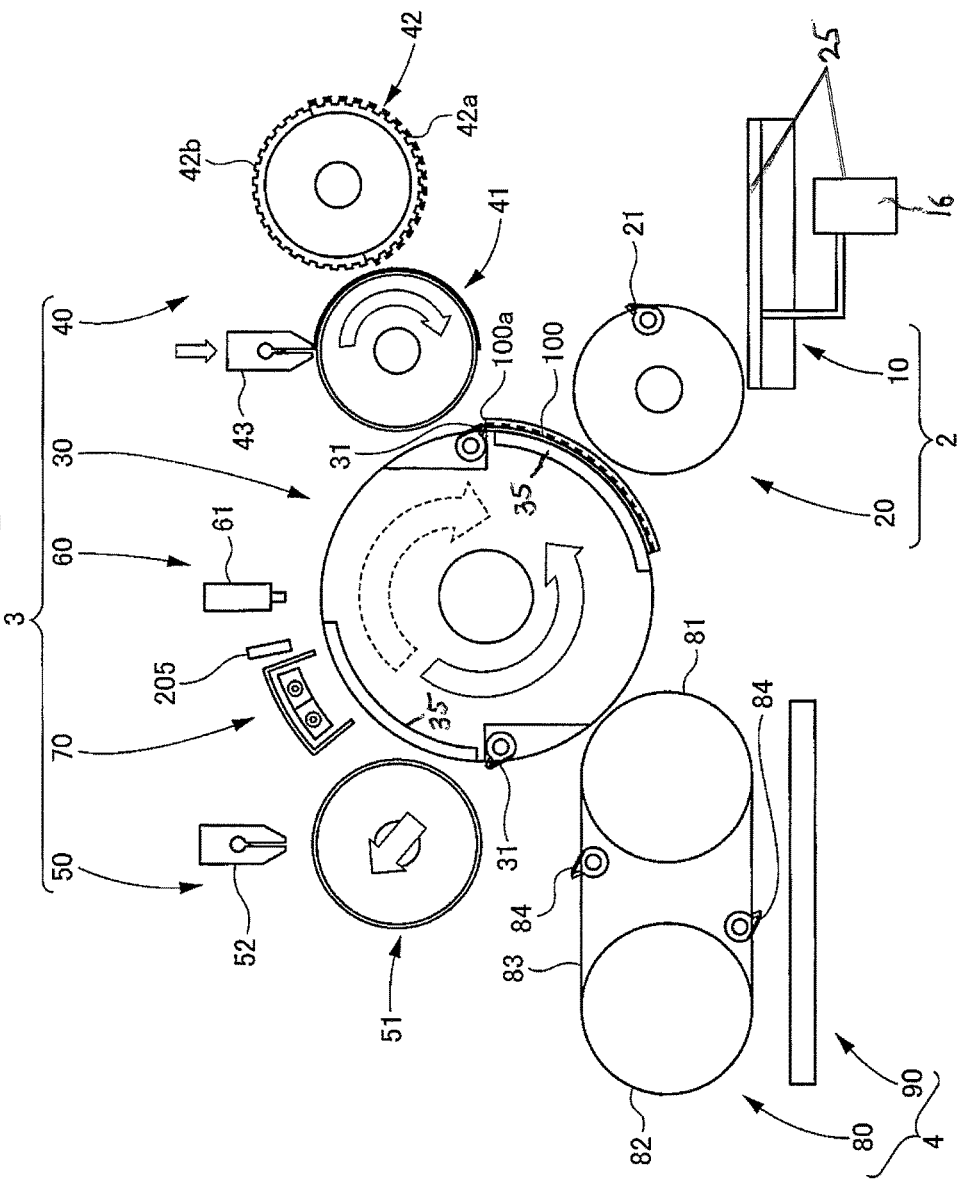

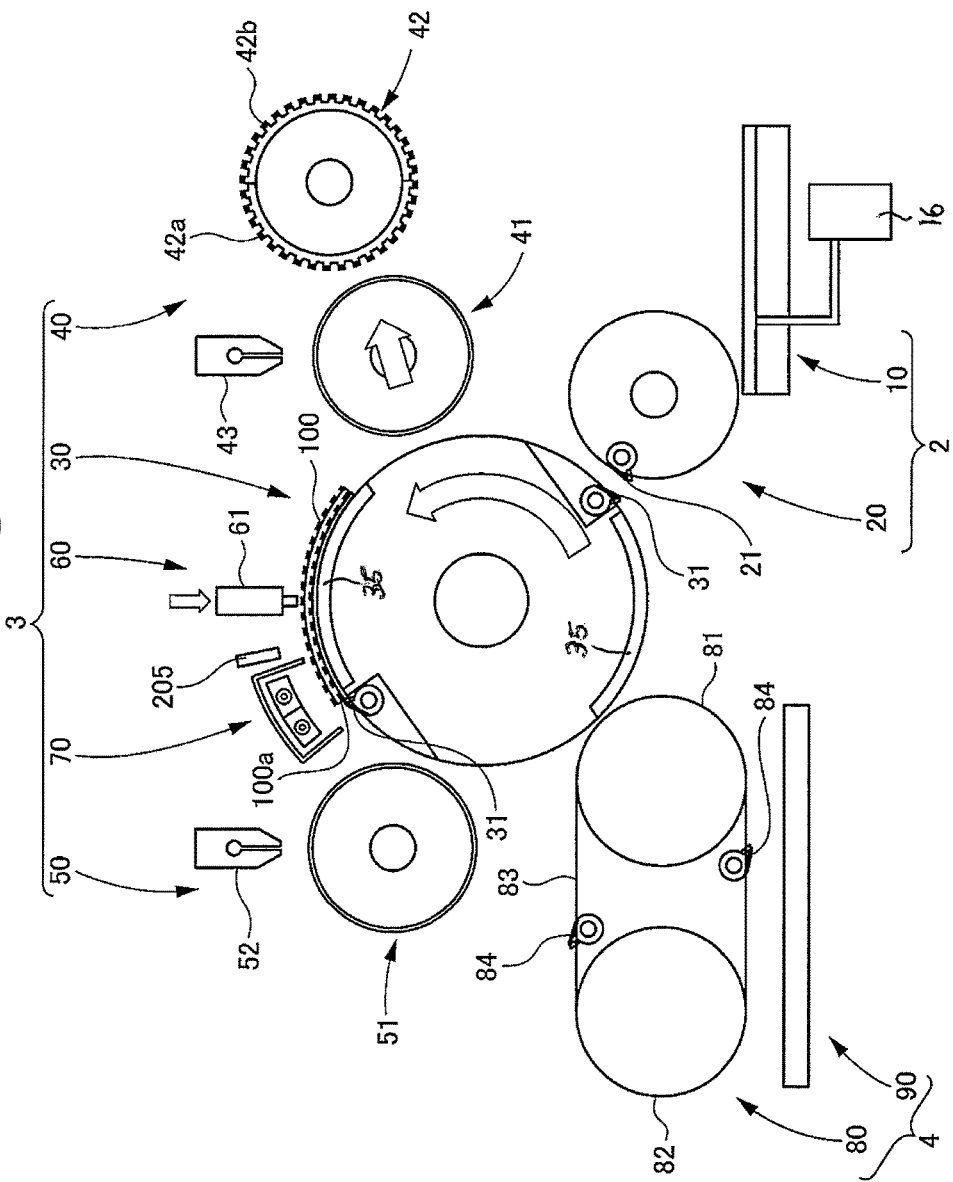

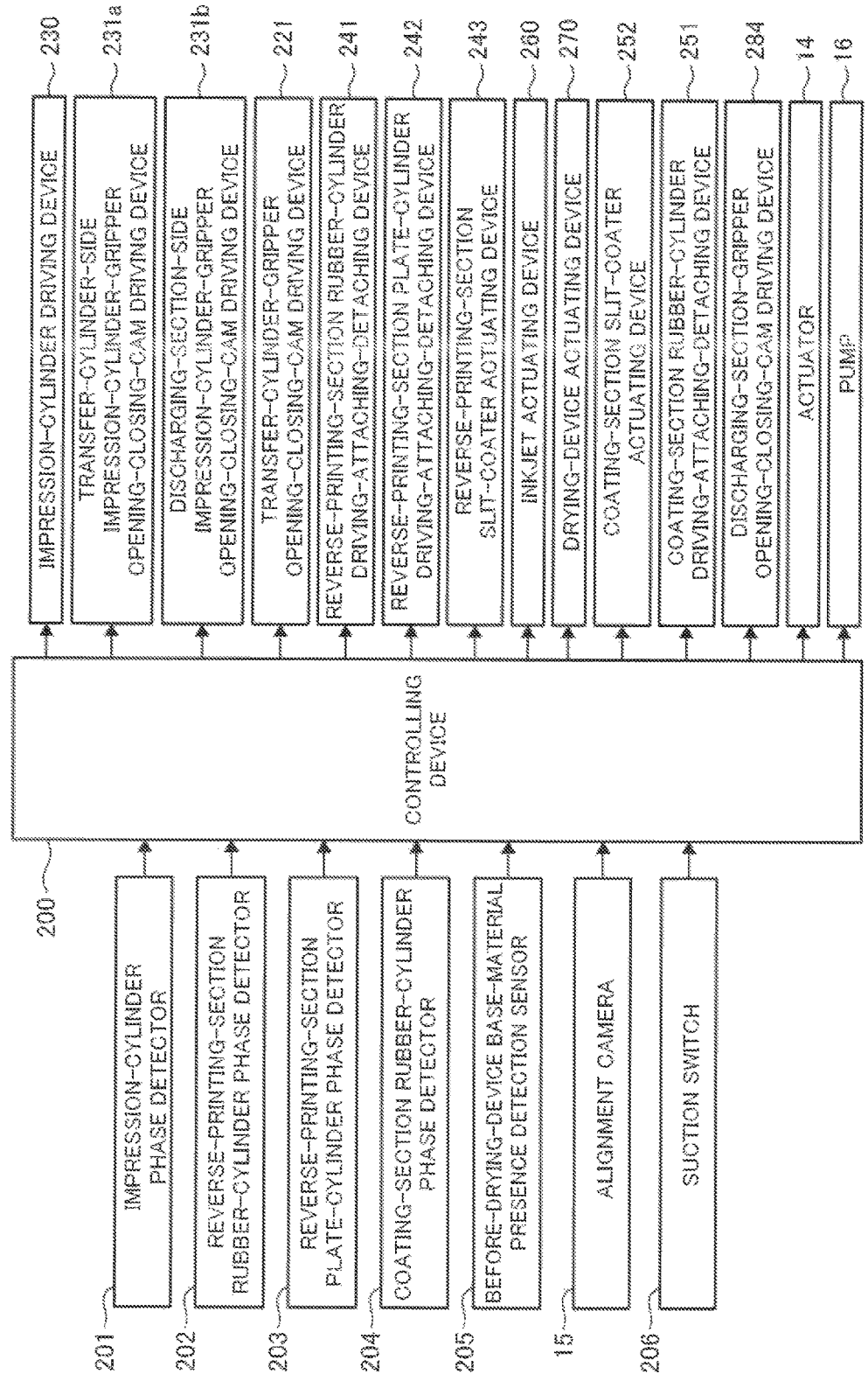

FLEXIBLE-ELECTRONIC-DEVICE MANUFACTURING APPARATUS

TECHNICAL FIELD

The present invention relates to a flexible-electronic-device manufacturing apparatus for manufacturing an electronic device by stacking multiple functional layers onto a flexible base material by printing or coating application, to a printing device to be used to manufacture an electronic device, and to a flexible-electronic-device manufacturing method.

BACKGROUND ART

In recent years, flexible electronic devices have been drawing attention, in each of which functional layers such as finely-patterned interconnections are formed on a flexible base material such as a film. Examples of such flexible electronic devices include a thin-film transistor (hereinafter, referred to as a TFT in this description). For the manufacturing of these flexible electronic devices, photolithography has heretofore been employed which is capable of forming finely-patterned interconnections. However, electronic-device manufacturing methods using photolithography require time- and effort-consuming processes such as preparing a high-temperature vacuum environment, and therefore take many manufacturing man-hours and high manufacturing cost. For this reason, a flexible-electronic-device manufacturing method as an alternative for photolithography has been desired.

As an electronic-device manufacturing method as an alternative for photolithography, there has been printed electronics (hereinafter, referred to as PE in this description), for example. The manufacturing of a flexible electronic device employing PE involves forming finely-patterned interconnections onto a flexible base material by a printing method or a coating applying method to make a flexible electronic device. As compared to the manufacturing of a flexible electronic device employing photolithography, this method does not require time- and effort-consuming processes and can therefore reduce the manufacturing man-hours and also greatly lower the manufacturing cost.

CITATION LIST

Patent Literature (Patent Literature 1) Japanese Patent Application Publication No. 2007-268715

SUMMARY OF INVENTION

Technical Problem

Patent Literature 1, for example, describes a technique as a TFT forming method employing this PE. The TFT forming method described in Patent Literature 1 forms conductive material in electrode patterns onto a base material by using high-resolution reverse printing to form the conductive material accurately on predetermined positions on the base material.

Here, a TFT includes a gate layer, an insulating layer, a source-drain layer, and a semiconductor stacked on a base material, and manufacturing such a TFT requires aligning the positions of these layers relative to each other and stacking them accurately. To stack multiple layers onto a base material by employing the technique disclosed in Patent Literature 1, the base material needs to be moved among different apparatuses for forming the respective layers, and each time the base material is moved, it must be positioned accurately relative to the apparatus. This preparing work for the accurate positioning may increase the burden on the operator and increase the manufacturing man-hours and the manufacturing cost.

The present invention has been made in view of the above problem, and an object thereof is to manufacture a flexible electronic device accurately with fewer manufacturing man-hours by reducing preparing work such as positioning required for each step for stacking multiple layers.

Solution to Problem

A flexible-electronic-device manufacturing apparatus according to a first aspect of the present invention for solving the above problem provides a flexible-electronic-device manufacturing apparatus for manufacturing an electronic device including a flexible base material and a plurality of functional layers provided thereon, including: an impression cylinder configured to hold and transport the base material; impression-cylinder driving means for rotating the impression cylinder; processing means for performing a plurality of processes for providing the plurality of functional layers by a printing method or a coating applying method on the base material held on the impression cylinder; impression-cylinder phase detecting means for detecting a phase of the impression cylinder; and controlling means for controlling the impression-cylinder driving means and the processing means based on a result of detection by the impression-cylinder phase detecting means. Here, the plurality of processes by the processing means are for stacking some or all of the plurality of functional layers which form the electronic device.

A flexible-electronic-device manufacturing apparatus according to a second aspect of the present invention for solving the above problem provides the flexible-electronic-device manufacturing apparatus according to the first aspect of the present invention, in which as means for performing at least one of the plurality of processes on the base material, the processing means includes a rubber cylinder configured to be in contact with the impression cylinder, rubber-cylinder driving means for rotating the rubber cylinder, rubber-cylinder attaching-detaching means for attaching and detaching the rubber cylinder to and from the impression cylinder, and rubber-cylinder phase detecting means for detecting a phase of the rubber cylinder, and the controlling means controls the impression-cylinder driving means, the rubber-cylinder driving means, and the rubber-cylinder attaching-detaching means based on results of detection by the impression-cylinder phase detecting means and the rubber-cylinder phase detecting means.

A flexible-electronic-device manufacturing apparatus according to a third aspect of the present invention for solving the above problem provides the flexible-electronic-device manufacturing apparatus according to the second aspect of the present invention, in which as the means for performing the at least one process, the processing means further includes a plate cylinder configured to be in contact with the rubber cylinder, plate-cylinder driving means for rotating the plate cylinder, plate-cylinder attaching-detaching means for attaching and detaching the plate cylinder to and from the rubber cylinder, and plate-cylinder phase detecting means for detecting a phase of the plate cylinder, and the controlling means controls the impression-cylinder driving means, the rubber-cylinder driving means, the rubber-cylinder attaching-detaching means, the plate-cylinder driving means, and the plate-cylinder attaching-detaching means based on results of detection by the impression-cylinder phase detecting means, the rubber-cylinder phase detecting means, and the plate-cylinder phase detecting means.

A flexible-electronic-device manufacturing apparatus according to a fourth aspect of the present invention for solving the above problem provides the flexible-electronic-device manufacturing apparatus according to the third aspect of the invention, in which the plate cylinder is a multiple-size cylinder (a double-size or larger-size cylinder), and plurality of printing plates formed in mutually different patterns are attached to the plate cylinder.

A flexible-electronic-device manufacturing apparatus according to a fifth aspect of the present invention for solving the above problem provides the flexible-electronic-device manufacturing apparatus according to the first aspect of the present invention, in which the impression-cylinder driving means rotates the impression cylinder in forward and reverse directions.

A flexible-electronic-device manufacturing apparatus according to a sixth aspect of the present invention for solving the above problem provides the flexible-electronic-device manufacturing apparatus according to the first aspect of the present invention, in which the impression cylinder includes adhering means for allowing the base material to adhere to a surface of the impression cylinder.

A flexible-electronic-device manufacturing apparatus according to a seventh aspect of the present invention for solving the above problem provides the flexible-electronic-device manufacturing apparatus according to the first aspect of the present invention, in which the processing means includes a printing device configured to print a functional solution onto the base material by a printing method or a coating applying device configured to apply the functional solution onto the base material by a coating applying method, and a solidifying device configured to solidify the functional solution on the base material printed by the printing device or applied by the coating applying device.

A flexible-electronic-device manufacturing apparatus according to an eighth aspect of the present invention for solving the above problem provides the flexible-electronic-device manufacturing apparatus according to the first aspect of the present invention. Further including: feeding means for feeding the base material onto the impression cylinder; and discharging means for receiving the base material from the impression cylinder and discharging the base material, in which the controlling device controls the feeding means and the discharging means based on the result of detection by the impression-cylinder phase detecting means.

A flexible-electronic-device manufacturing apparatus according to a ninth aspect of the present invention for solving the above problem provides the flexible-electronic-device manufacturing apparatus according to the first aspect of the present invention, further including a base-material feeding unit configured to feed the base material onto the impression cylinder and including placing means on which to place the base material, sucking means for sucking the base material onto the placing means, position adjusting means for adjusting a position of the placing means, and position detecting means for detecting a position of the base material placed on the placing means, in which the controlling means controls the position adjusting means based on a result of detection by the position detecting means such that the base material is fed at a predetermined position onto the impression cylinder.

Advantageous Effects of Invention

According to the flexible-electronic-device manufacturing apparatus according to the first aspect of the present invention, it includes the processing means for performing the plurality of processes by a painting method or a coating applying method on a base material held on the impression cylinder. Thus, the plurality of processes can be performed on the base material by performing preparation work such as positioning only once in the flexible-electronic-device manufacturing apparatus. Accordingly, it as possible to reduce the preparing work such as positioning required for each step for providing the plurality of layers. Therefore, a flexible electronic device can be manufactured accurately with fewer manufacturing man-hours.

According to the flexible-electronic-device manufacturing apparatus according to the second aspect of the present invention, the processing means is provided with the rubber cylinder configured to be in contact with the impression cylinder, the rubber-cylinder driving means for rotating the rubber cylinder, the rubber-cylinder attaching-detaching means for attaching and detaching the rubber cylinder to and from the impression cylinder, and the rubber-cylinder phase detecting means for detecting the phase of the rubber cylinder, and the impression-cylinder driving means, the rubber-cylinder driving means, and the rubber-cylinder attaching-detaching means are controlled based on the results of detection by the impression-cylinder phase detecting means and the rubber-cylinder phase detecting means. Thus, it is possible to perform a process by a printing method or a coating applying method through the rubber cylinder, independently of other processes and the like.

According the flexible-electronic-device manufacturing apparatus according to the third aspect of the present invention, the processing means is provided with the plate cylinder configured to be in contact with the rubber cylinder, the plate-cylinder driving means for rotating the plate cylinder, the plate-cylinder attaching-detaching means for attaching and detaching the plate cylinder to and from the rubber cylinder, and the plate-cylinder phase detecting means for detecting the phase of the plate cylinder, and the impression-cylinder driving means, the rubber-cylinder driving means, the rubber-cylinder attaching-detaching means, the plate-cylinder driving means, and the plate-cylinder attaching-detaching means are controlled based on the results of detection by the impression-cylinder phase detecting means, the rubber-cylinder phase detecting means, and the plate-cylinder phase detecting means. Thus, it is possible to perform a process by a printing method through the plate cylinder and the rubber cylinder, independently of other processes and the like.

According to the flexible-electronic-device manufacturing apparatus according to the fourth aspect of the present invention, the plate cylinder is a multiple-size cylinder, and a plurality of printing plates formed in mutually different patterns are attached to the plate cylinder. In this way, different processes (printing) can be performed with one processing device in the processing means. Thus, the number of processing devices in the processing means provided to the flexible-electronic-device manufacturing apparatus can be reduced. Accordingly, it is possible to reduce the number of components of the flexible-electronic-device manufacturing apparatus and therefore suppress increase in manufacturing cost and apparatus size.

According to the flexible-electronic-device manufacturing apparatus according to the fifth aspect of the present invention, the impression cylinder is rotated in the forward and reverse directions. Thus, it is possible to select the shortest path for transporting the base material held on the impression cylinder to a position at which to perform a process on the base material. Thus, each time the base material held on the impression cylinder is transported to a position for performing a given process, the shortest path can be selected for transporting the base material to the position. Accordingly, it is possible to shorten the time for manufacturing a flexible electronic device in the flexible-electronic-device manufacturing apparatus and also improve the mass productivity.

According to the flexible-electronic-device manufacturing apparatus according to the sixth aspect of the present invention, the base material is allowed to adhere to the surface of the impression cylinder. Thus, improper transport of the base material during the forward and reverse rotation of the impression cylinder can be reduced. Accordingly, it is possible to improve the quality of the flexible electronic device and reduce defects in the device, breakages of components, and the like, and therefore lower the running cost and the like.

According to the flexible-electronic-device manufacturing apparatus according to the seventh aspect of the present invention, it includes the printing device or the coating applying device, and the solidifying device as the processing means. Thus, the functional solution on the base material printed by the printing device or applied by the coating applying device can be quickly (proactively) solidified. Accordingly, it is possible to shorten the time for manufacturing a flexible electronic device in the flexible-electronic-device manufacturing apparatus. Moreover, when a process is performed on the base material by the processing device, the functional solution used in the printing method or the coating applying method is prevented from being mixed or reversely transferred. Accordingly, it is possible to improve the quality of the flexible electronic device and reduce defects in the device, breakages of components, and the like, and therefore lower the running cost and the like.

According to the flexible-electronic-device manufacturing apparatus according to the eighth aspect of the present invention, it includes the feeding means for feeding the base material onto the impression cylinder, and the discharging means for receiving the base material from the impression cylinder and discharging the base material. Thus, the base material can be fed and discharge automatically. Accordingly, it is possible to improve the productivity of the flexible electronic device by the flexible-electronic-device manufacturing apparatus.

According to the flexible-electronic-device manufacturing apparatus according to the ninth aspect of the present invention, the base-material feeding unit is provided with the placing means on which to place the base material, the position adjusting means for adjusting the position of the placing means, and the position detecting means for detecting the position of the base material placed on the placing means, and the controlling means controls the position adjusting means based on the result of detection by the position detecting means. Thus, the base material can be fed at a predetermined position onto the impression cylinder. Moreover, by controlling the position adjusting means based on the result of detection by the position detecting means, it is possible to eliminate preparation work for positioning which would otherwise be a cause of increase in the burden on the operator.

BRIEF DESCRIPTION OF DRAWINGS

FIG. 6 is a block diagram showing a control system of the flexible-electronic-device manufacturing apparatus according to Embodiment 1.

FIG. 7A is an explanatory view showing the operation of the flexible-electronic-device manufacturing apparatus according to the present invention.

FIG. 7G is an explanatory view showing the operation of the flexible-electronic-device manufacturing apparatus according to the present invention.

FIG. 7J is an explanatory view showing the operation of the flexible-electronic device manufacturing apparatus according to the present invention.

FIG. 10 is a block diagram showing a control system of the flexible-electronic-device manufacturing apparatus according to Embodiment 2.

DESCRIPTION OF EMBODIMENTS

Hereinbelow, embodiments of a flexible-electronic-device manufacturing apparatus according to the present invention will be described in detail with reference to the accompanying drawings. It is, of course, needless to say that the present invention is not limited to the following embodiments and that various changes can be made without departing from the gist of the present invention.

{Embodiment 1}

A flexible-electronic-device manufacturing apparatus according to this embodiment and a flexible electronic device which is manufactured by using this apparatus will be described with reference to FIGS. 1 to 3.

The flexible-electronic-device manufacturing apparatus according to this embodiment is configured to perform multiple processes on a base material for manufacturing a flexible electronic device.

Figure 1:
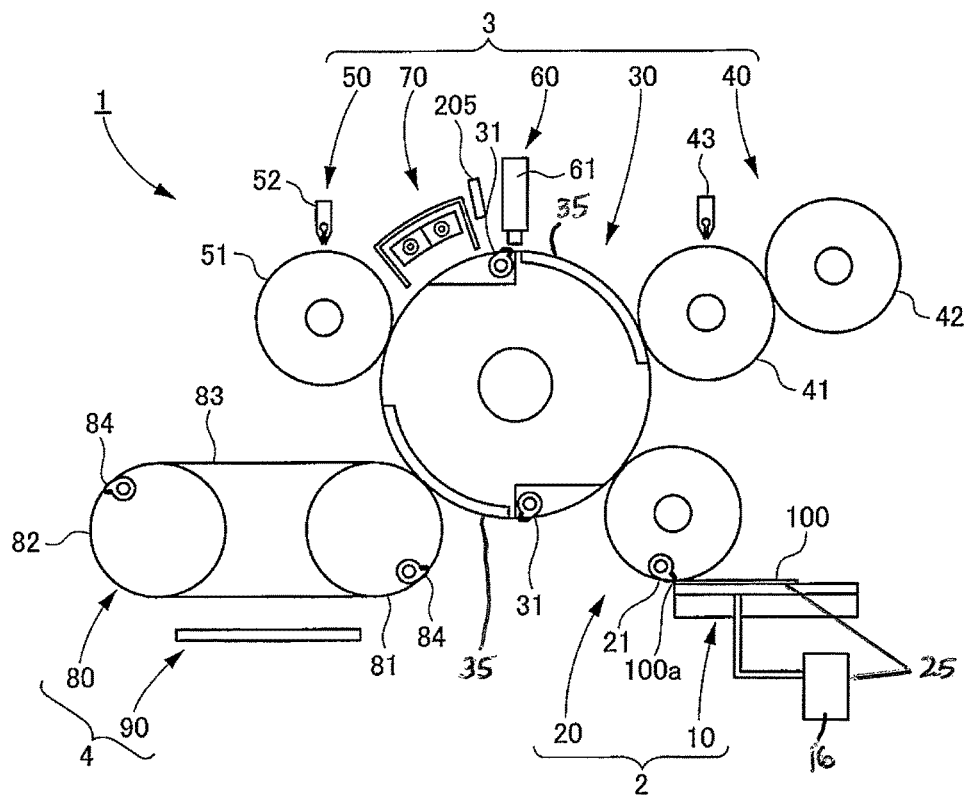
FIG. 1 is a schematic view showing a flexible-electronic-device manufacturing apparatus according to the present invention.
Figure 2:
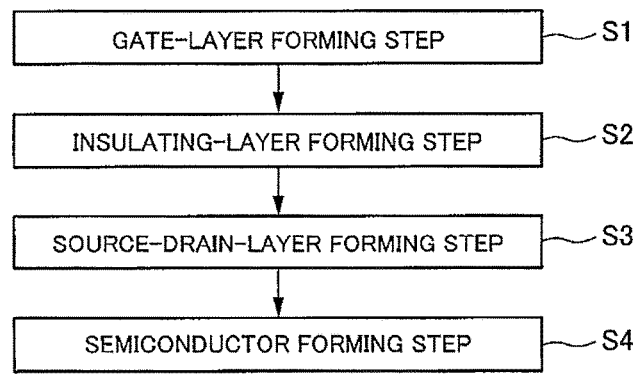
FIG. 2 is a flowchart showing steps performed by the flexible-electronic-device manufacturing apparatus according to the present invention.

As shown in FIG. 1, a flexible-electronic-device manufacturing apparatus 1 includes: a base-material feeding unit 2 as feeding means for feeding a film substrate 100 which is a base material; a base-material processing unit 3 configured to perform later-described multiple processes on the film substrate 100 fed by the base-material feeding unit 2; and a base-material discharging unit 4 as discharging means for discharging the film substrate 100 having undergone the processes in the base-material processing unit 3.

The film substrate 100 fed by the base-material feeding unit 2 undergoes various processes through multiple steps (S1 to S4 shown in FIG. 2) in the base-material processing unit 3. As a result, as shown in FIG. 3, a gate layer 110, an insulating layer 120, a source-drain layer 130, and a semiconductor 140 are stacked accurately on the film substrate 100 as functional layers, and then discharged by the base-material discharging unit 4 (see FIG. 1).

Note that, though not shown, the discharged film substrate 100 is set in an oven not shown, which is separate from the flexible-electronic-device manufacturing apparatus 1, and calcination or cross-linking of the layers 110, 120, 130, and 140 stacked on the film substrate 100 is performed in the oven. As a result, a flexible electronic device is obtained.

Examples of the film substrate 100 used in this embodiment include film-shaped materials of polyethylene terephthalate (PET), polyethylene naphthalate (PEN), polycarbonate (PC), polyimide (PI), flexible glass, cellulose (a kind of paper), and the like having a thickness of about 20 to 300 μm.

The base-material feeding unit 2, the base-material processing unit 3, and the base-material discharging unit 4 of the flexible-electronic-device manufacturing apparatus 1 will be described in detail.

First, the configuration of the base-material feeding unit 2 will be described with reference to FIG. 1 and FIGS. 4 to 6.

As shown in FIG. 1, the base-material feeding unit 2 includes a feeding device 10 configured to feed the film substrate 100, and a double-size transfer cylinder 20 as transporting means for transferring the film substrate 100 fed by the feeding device 10 to the base-material processing unit 3.

The film substrate 100 is transported by the feeding device 10 to a feeding position (the position shown in FIGS. 1 and 5B), at which the film substrate 100 is gripped and held at its transporting-direction upstream end portion 100a by a gripper device 21 provided to the transfer cylinder 20. The film substrate 100 is then transported by rotational movement of the transfer cylinder 20 (see FIG. 5C) and fed to the base-material processing unit 3. Here, the feeding position refers to a position at which the film substrate 100 is fed from the feeding device 10 onto the transfer cylinder 20, i.e. a predetermined position at which the gripper device 21 grips the film substrate 100.

The transfer cylinder 20 is in contact with an impression cylinder 30 of the base-material processing unit 3 to be described later, and coupled to the impression cylinder 30 by a gear mechanism not shown. The transfer cylinder 20 is rotationally driven along with the impression cylinder 30. The gripper device 21 of the transfer cylinder 20 opens and closes its grippers, i.e. switches between an action for gripping the film substrate 100 and transferring it onto the impression cylinder 30 and an action for not gripping the film substrate 100 and therefore not transferring it onto the impression cylinder 30, by means of a transfer-cylinder-gripper opening-closing-cam driving device 221 (see FIG. 6).

The transporting means in the present invention is not limited to the transfer cylinder 20 in this embodiment. For example, the transporting means may be an independently driven transfer cylinder independent of the impression cylinder 30, a single-size transfer cylinder, a triple-size or larger-size transfer cylinder (a multiple-size transfer cylinder), a swing device requiring no transfer cylinder, or the like.

Figure 4:
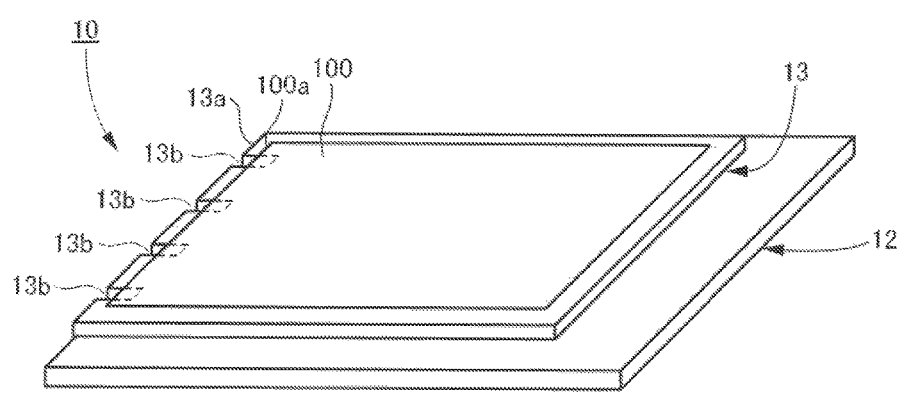
FIG. 4 is a schematic perspective view showing a feeding device of a base-material feeding unit of a flexible-electronic-device manufacturing apparatus according to Embodiment 1.

As shown in FIG. 4, the feeding device 10 includes: a transporting table 12 capable of moving on a transporting base 11 (see FIGS. 5A to 5C) by means of a drive source not shown; and a placing board 13 as placing means which is disposed on the transporting table 12 for placing the film substrate 100.

The placing board 13 is a plate-shaped member on which the film substrate 100 can be placed, and is provided with multiple (four in this embodiment) notched portions 13b in a transporting-direction upstream end portion 13a at positions corresponding to the moving paths of the grippers of the gripper device 21 (see FIG. 1) of the transfer cylinder 20.

By providing the notched portions 13b to the placing board 13 as described above, it is possible to avoid interference between the gripper device 21 of the transfer cylinder 20 and the placing board 13 of the feeding device 10 when the film substrate 100 is transferred onto the transfer cylinder 20 from the feeding device 10.

Note that the transporting table 12 in this embodiment is configured to be capable of moving between a base-material setting position (see FIG. 5A) at which the film substrate 100 is placed onto the placing board 13 and a feeding position (see FIG. 5B) at which the gripper device 21 of the transfer cylinder 20 grips the film substrate 100, and its movement mechanism, drive source, and the like are not particularly limited. In order to accurately move the film substrate 100 from the base-material setting position to the feeding position, it is preferable to use a linear motor not shown or the like to linearly drive the transporting table 12.

The base-material setting position and the feeding position mentioned above may of course be the same position, and the film substrate 100 may of course be set and fed to the gripper device 21 of the transfer cylinder 20 without moving the transporting table 12.

Next, the configuration of the base-material processing unit 3 will be described with reference to FIGS. 1 to 3.

As shown in FIG. 1, the base-material processing unit 3 includes: a quadruple-size impression cylinder 30 configured to receive the film substrate 100 from the transfer cylinder 20 of the base-material feeding unit 2; and processing devices 40, 50, 60, and 70 as processing means disposed next to each other around the impression cylinder 30. The grip on the film substrate 100 is switched from the gripper device 21 of the transfer cylinder 20 to one of gripper devices 31 provided to the impression cylinder 30, so that the film substrate 100 is fed from the base-material feeding unit 2 to the base-material processing unit 3.

The impression cylinder 30 is configured to be rotationally driven by an impression-cylinder driving device 230 (see FIG. 6) serving as impression-cylinder driving means, in such a way as to be capable of forward and reverse rotations. Such gripper device 31 of the impression cylinder 30 is configured to open and close its grippers by means of a transfer-cylinder-side impression-cylinder-gripper opening-closing-cam driving device 231a and a discharging-section-side impression-cylinder-gripper opening-closing-cam driving device 231b (see FIG. 6). The film substrate 100 is gripped and held at the transporting-direction upstream end portion 100a (the end portion on the upstream side in the transporting direction while the impression cylinder 30 is rotationally driven in the forward direction) by the gripper device 31 of the impression cylinder 30. For this reason, the impression cylinder 30 includes adhering means so that the trailing side of the film substrate 100 which is not gripped by the gripper device 31 will not be detached from the surface of the impression cylinder 30 while the impression cylinder 30 is rotationally driven in the reverse direction.

In this embodiment, an adhesive sheet (not shown) made of a polymer material is attached as the adhering means to the surface of the impression cylinder 30. The film substrate 100 held on the impression cylinder 30 by the gripper device 31 is held such that substantially the entire surface thereof adheres to the surface of the impression cylinder 30. By providing the impression cylinder 30 with the adhering means for allowing the film substrate 100 to adhere to the surface of the impression cylinder 30 as described above, the trailing side of the film substrate 100 which is not held by the gripper device 31 will not be detached from the surface of the impression cylinder 30 even while the impression cylinder 30 is rotationally driven in the reverse direction by the operation of the impression-cylinder driving device 230. Thus, it is possible to, for example, stably transport and discharge the film substrate 100 held by the gripper device 31 of the impression cylinder 30.

The adhering means 35 provided to the impression cylinder 30 is not limited to one like this embodiment which is obtained by attaching a polymer material having adhesibility such as porous porous or silicon and which allows the film substrate 100 to adhere to the surface of the impression cylinder 30. For example, a gripper device (not shown) may be used to grip the trailing side of the film substrate 100 held on the impression cylinder 30.

The processing devices 40, 50, 60, and 70 are processing means for performing multiple processes to provide (stack) multiple functional layers on the film substrate 100 held on the impression cylinder 30 by a printing method or a coating applying method. In this embodiment, they are: a reverse printing device 40 as a printing device configured to print a functional solution for forming a functional layer by reverse printing; a coating device 50 as a coating applying device configured to apply a functional solution for forming a functional layer by a coating method; an inkjet printing device 60 as a printing device configured to print a functional solution for forming a functional layer by inkjet printing; and a drying device (solidifying device) 70 configured to dry (solidify) the functional solution printed or applied on the film substrate 100.

The processing means in the present invention is of course not limited to the reverse printing device 40, the coating device 50, the inkjet printing device 60, and the drying device 70 in this embodiment. The processing means may be any means as long as it performs multiple processes in given stages of manufacturing of a flexible electronic device by, for example, printing or applying one of the multiple functional layers winch form the electronic device, and then providing the film substrate 100 kept held on the impression cylinder 30 with another functional layer onto the one functional layer by printing or coating application.

As the processing means, a gravure printing device configured to perform a processing by gravure printing, an intaglio printing device configured to perform a process by intaglio printing, a relief printing device configured to perform a process by relief printing, for example, may be disposed next to each other around the impression cylinder 30. Alternatively, coating applying devices configured to perform processes by various coating applying methods, instead of the processes by the above printing processes, may be disposed next to each other around the impression cylinder 30. The contents and the number of processes performed by the processing means are of course not limited to those in this embodiment.

The reverse printing devise 40 is means for performing one of the multiple processes on the film substrate 100, and is configured to print a conductive solution (functional solution) for forming the gate layer 110 and the source-drain layer 130 in predetermined patterns onto the film substrate 100 by use of reverse printing. As shown in FIG. 1, if the reverse printing device 40 includes: a double-size rubber cylinder 41 configured to be in contact with the impression cylinder 30; a double-size reversal plate cylinder 42 configured to be in contact with the rubber cylinder 41; a slit die 43 disposed above and near the rubber cylinder 41; and a conductive-solution feeding device not shown.

The rubber cylinder 41 is configured to be rotationally driven in such a way as to be capable of forward and reverse rotations independently of the impression cylinder 30 and is capable of being attached and detached to and from the impression cylinder 30, by means of a reverse-printing-section rubber-cylinder driving-attaching-detaching device 241 (see FIG. 6) serving as rubber-cylinder driving means and rubber-cylinder attaching-detaching means. Moreover, the reversal plate cylinder 42 is configured to be rotationally driven independently of the impression cylinder 30 and the rubber 41 and is capable of being attached and detached to and from the rubber cylinder 41, by means of a reverseprinting-section plate-cylinder driving-attaching-detaching device 242 (see FIG. 6) serving as plate-cylinder driving means and plate-cylinder attaching-detaching means.

Figure 7B:
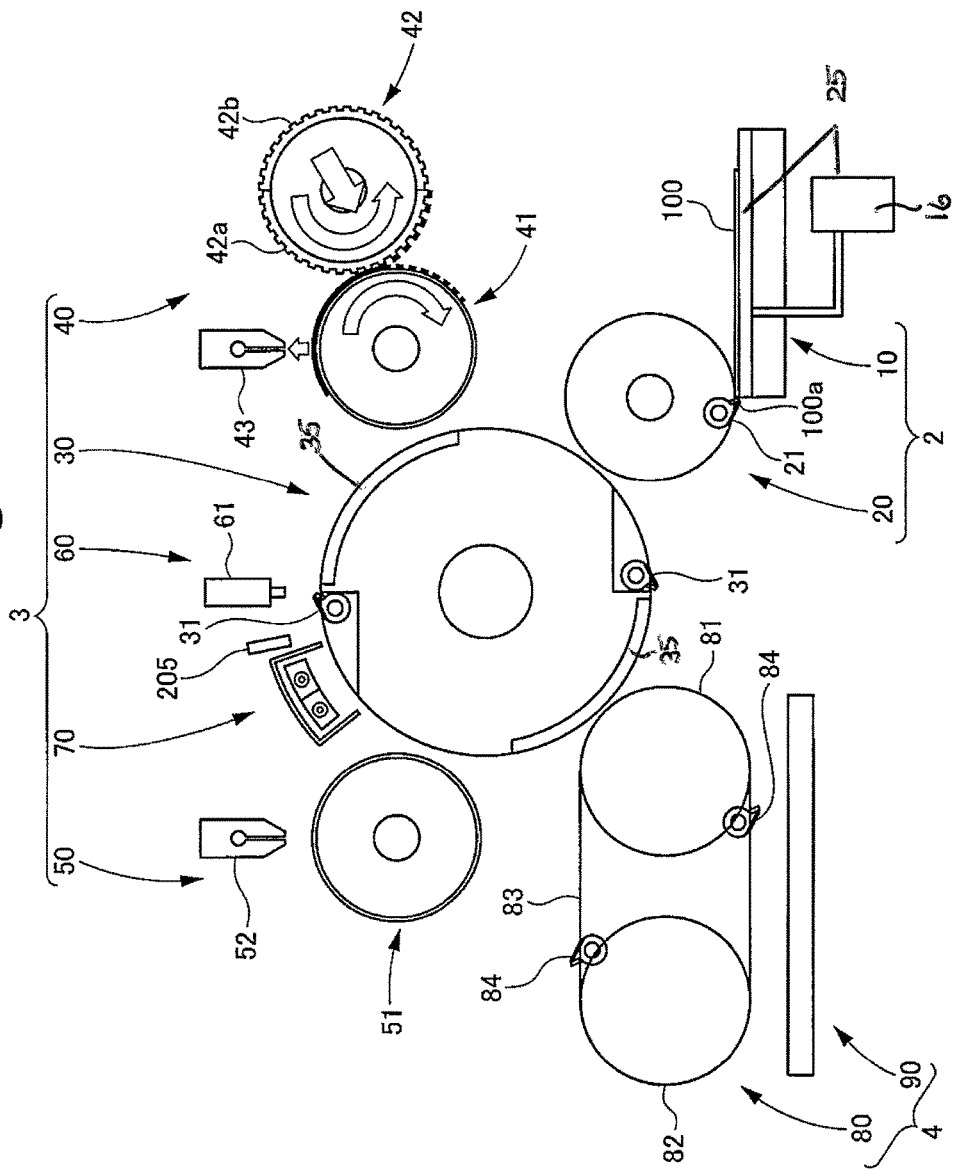
FIG. 7B is an explanatory view showing the operation of the flexible-electronic-device manufacturing apparatus according to the present invention.
Figure 7C:
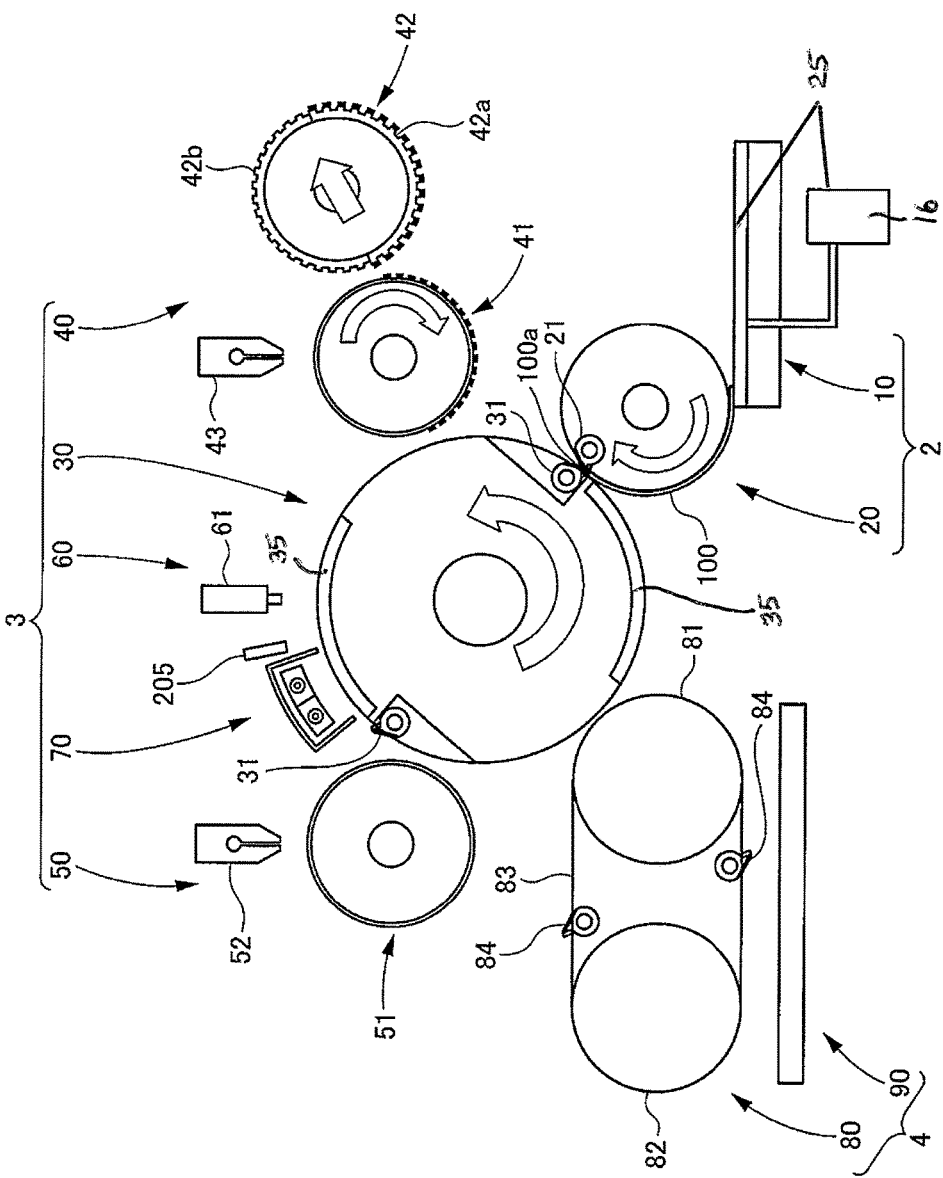
FIG. 7C is an explanatory view showing the operation of the flexible-electronic-device manufacturing apparatus according to the present invention.
Figure 7D:
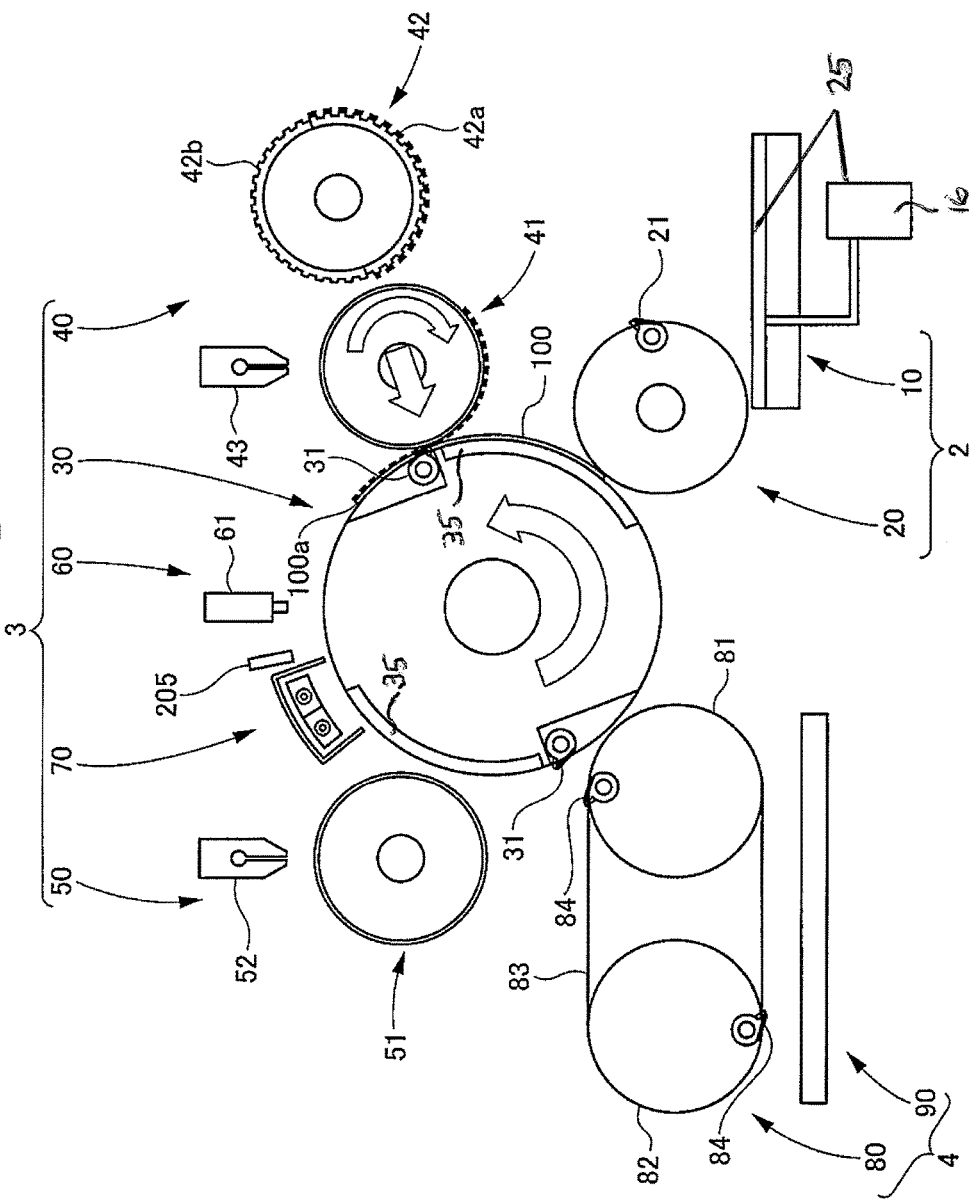
FIG. 7D is an explanatory view showing the operation of the flexible-electronic-device manufacturing apparatus according to the present invention.

Moreover, the slit die 43 of the reverse printing device 40 is configured to be actuated by a reverse-printing-section slit-coater actuating device 243 (see FIG. 6). When a process is to be performed by reverse printing, the slit die 43 is moved downward and set to a solution feeding position near the rubber cylinder 41, and the conductive solution is fed to the slit die 43 and the rubber cylinder 41 from the conductive-solution feeding device not shown (see FIG. 7A). When no process is to be performed by reverse printing, the slit die 43 is moved upward and set to a standby position away from the rubber cylinder 41, and the feed of the conductive solution to the slit die 43 and the rubber cylinder 41 from the conductive-solution feeding device not shown is stopped (see FIG. 7B).

The conductive solution used in the reverse printing device 40 is a solution usable for the formation of both the gate layer 110 and the source-drain layer 130, and the reverse printing device 40 uses reverse printing to perform both the printing for forming the gate layer 110 and the printing for forming the source-drain layer 130. The conductive solution is not particularly limited to but includes a functional solution in which metal nanoparticles are dissolved. Examples of the metal nanoparticles include gold, silver, copper, nickel, platinum, palladium, rhodium, and the like, and examples of the solvent include water, alcohol, and the like.

The processing means in the present invention may of course use different conductive solutions for the formation of the gate layer 110 and the formation of the source-drain layer 130 and use different devices for the printing for forming the gate layer 110 and the printing for forming the source-drain layer 130.

The conductive solution is fed from the conductive-solution feeding device not shown into the slit die 43 and then fed from the lower side of the slit die 43 onto the rubber cylinder 41 rotationally driven. After the conductive solution is fed onto the peripheral surface of the rubber cylinder 41, the conductive solution in a negative pattern (non-image portions) is removed by a printing plate 42a or 42b provided on the peripheral surface of the reversal plate cylinder 42, and only the conductive solution in a positive pattern (image portions) remains on the peripheral surface of the rubber cylinder 41. The conductive solution in the positive pattern remaining on the peripheral surface of the rubber cylinder 41 is transferred onto the film substrate 100 held on the peripheral surface of the impression cylinder 30.

The two printing plates 42a and 42b formed in mutually different patterns are attached to the reversal plate cylinder 42 of the reverse printing device 40 in this embodiment. Thus, two patterns of reverse printing are possible by using one reverse printing device 40. The two printing plates 42a and 42b are a printing plate 42a for forming the gate layer and a printing plate 42b for forming the source-drain layer. These printing plates 42a and 42b are formed in patterns corresponding to their respective layers.

Thus, in a gate-layer forming step, reverse printing using the printing plate 42a on one side is performed to print the conductive solution in a gate-layer pattern onto the film substrate 100; in a source-drain-layer forming step, reverse printing using the printing plate 42b on the other side is performed to print the conductive solution in a source-drain-layer pattern onto the film substrate 100.

In sum, the reverse printing device 40 in this embodiment is capable of printing multiple functional layers (two layers in this embodiment) in mutually different patterns onto the film substrate 100 held on the impression cylinder 30; by printing the conductive solution in mutually different patterns onto the film substrate 100, the reverse printing device 40 functions as both a gate-layer forming device for forming the gate layer 110 and a source-drain-layer forming device for forming the source-drain layer 130. The printing operation of the reverse printing device 40 in the gate-layer forming step and the source-drain-layer forming step will be described later.

In this embodiment, the reverse printing device 40 performs printing for forming different layers, and therefore the reversal plate cylinder 42 is a double-size cylinder so that the two printing plates 42a and 42b can be attached thereto. However, the plate cylinder in the present invention is not limited to this case. For example, the plate cylinder in the present invention may be a triple-size or larger-size plate cylinder (a multiple-size plate cylinder) to which two printing plates are attached, or a triple-size or larger-size plate cylinder (a multiple-size plate cylinder) to which three or more printing plates are attached.

The coating device 50 is means for performing one of the multiple processes on the film substrate 100, and is configured to apply an insulative solution (functional solution) for forming the insulating layer 120 onto the film substrate 100 by using a coating method. As shown in FIG. 1, the coating device 50 includes: a rubber cylinder 51 configured to be in contact with the impression cylinder 30; a slit die 52 disposed above and near the rubber cylinder 51; and an insulative-solution feeding device not shown.

The rubber cylinder 51 is configured to be rotationally driven in such a way as to be capable of forward and reverse rotations independently of the impression cylinder 30 and is capable of being attached and detached to and from the impression cylinder 30, by means of a coating-section rubber-cylinder driving-attaching-detaching device 251 (see FIG. 6) serving as rubber-cylinder driving means and rubber-cylinder attaching-detaching means.

Figure 7E:
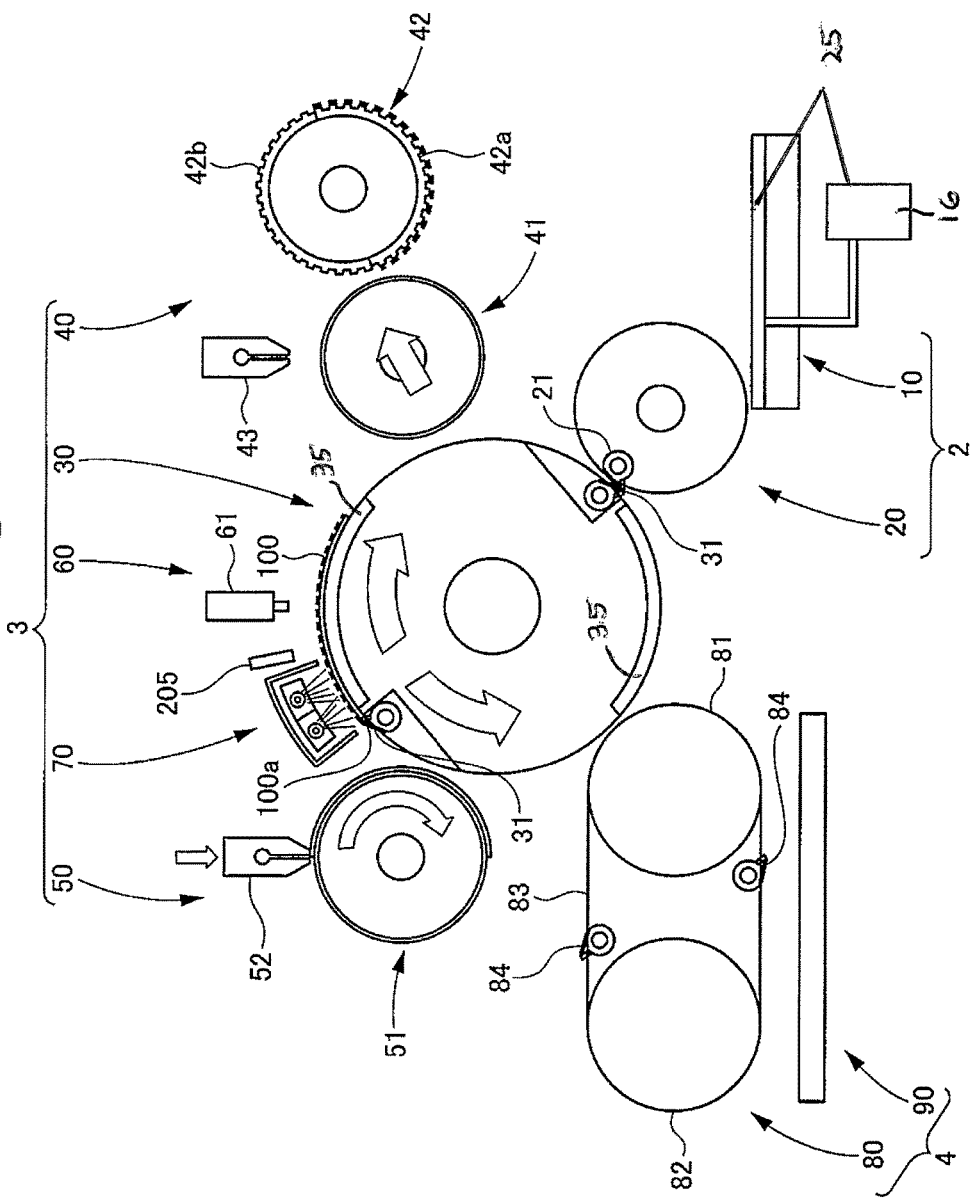
FIG. 7E is an explanatory view showing the operation of the flexible-electronic-device manufacturing apparatus according to the present invention.
Figure 7F:
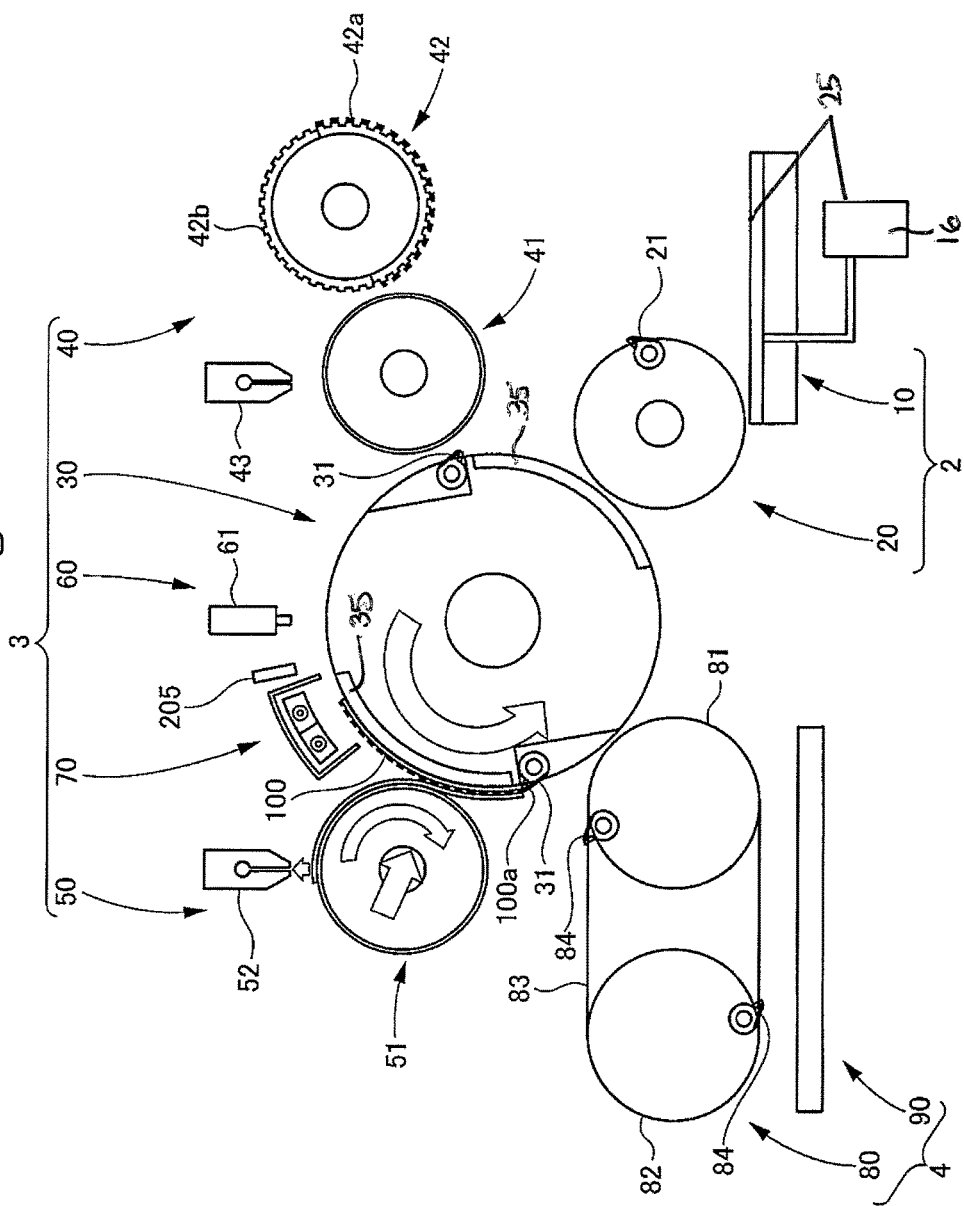
FIG. 7F is an explanatory view showing the operation of the flexible-electronic-device manufacturing apparatus according to the present invention.
Figure 7H:
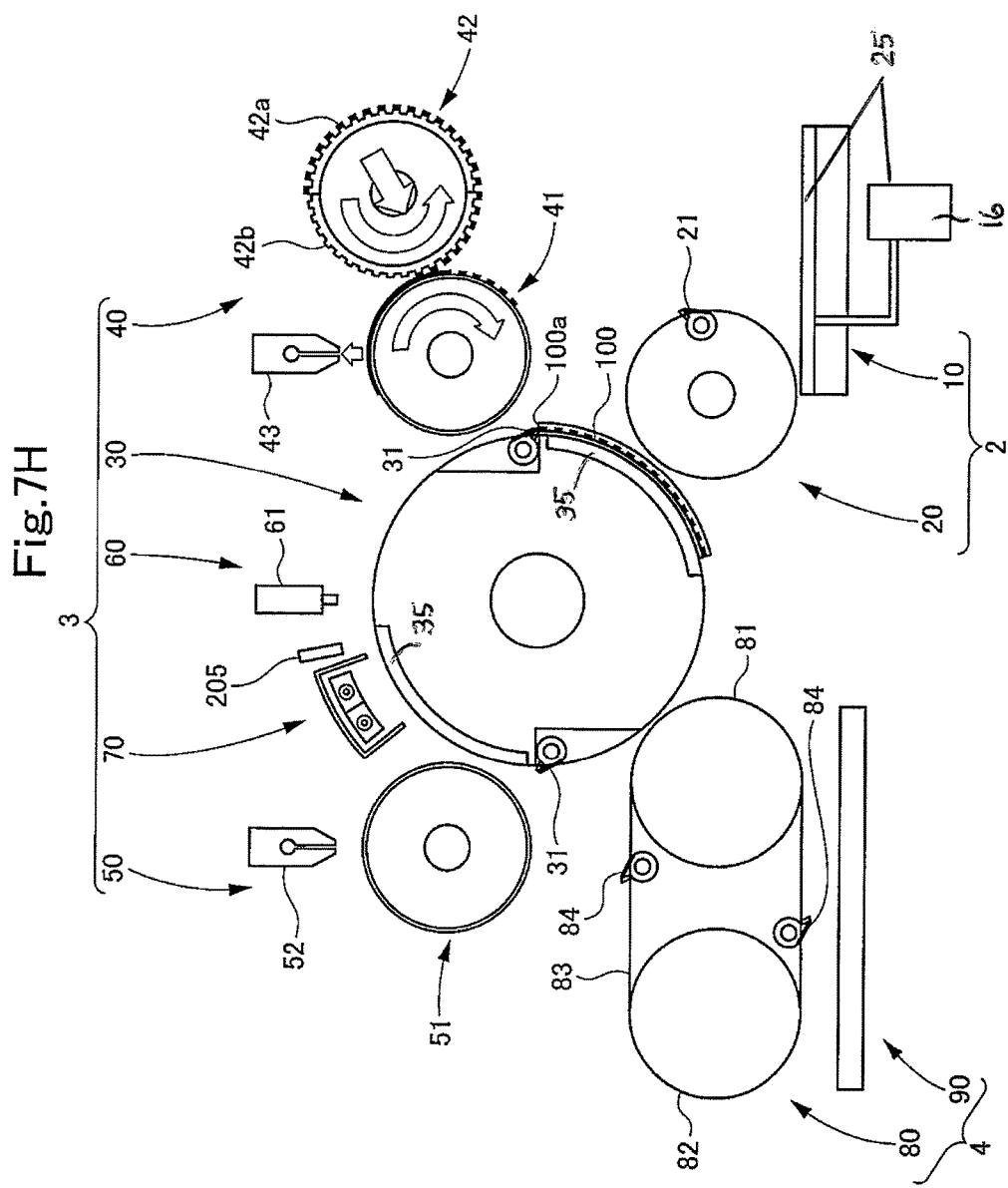
FIG. 7H is an explanatory view showing the operation of the flexible-electronic-device manufacturing apparatus according to the present invention.
Figure 7I:
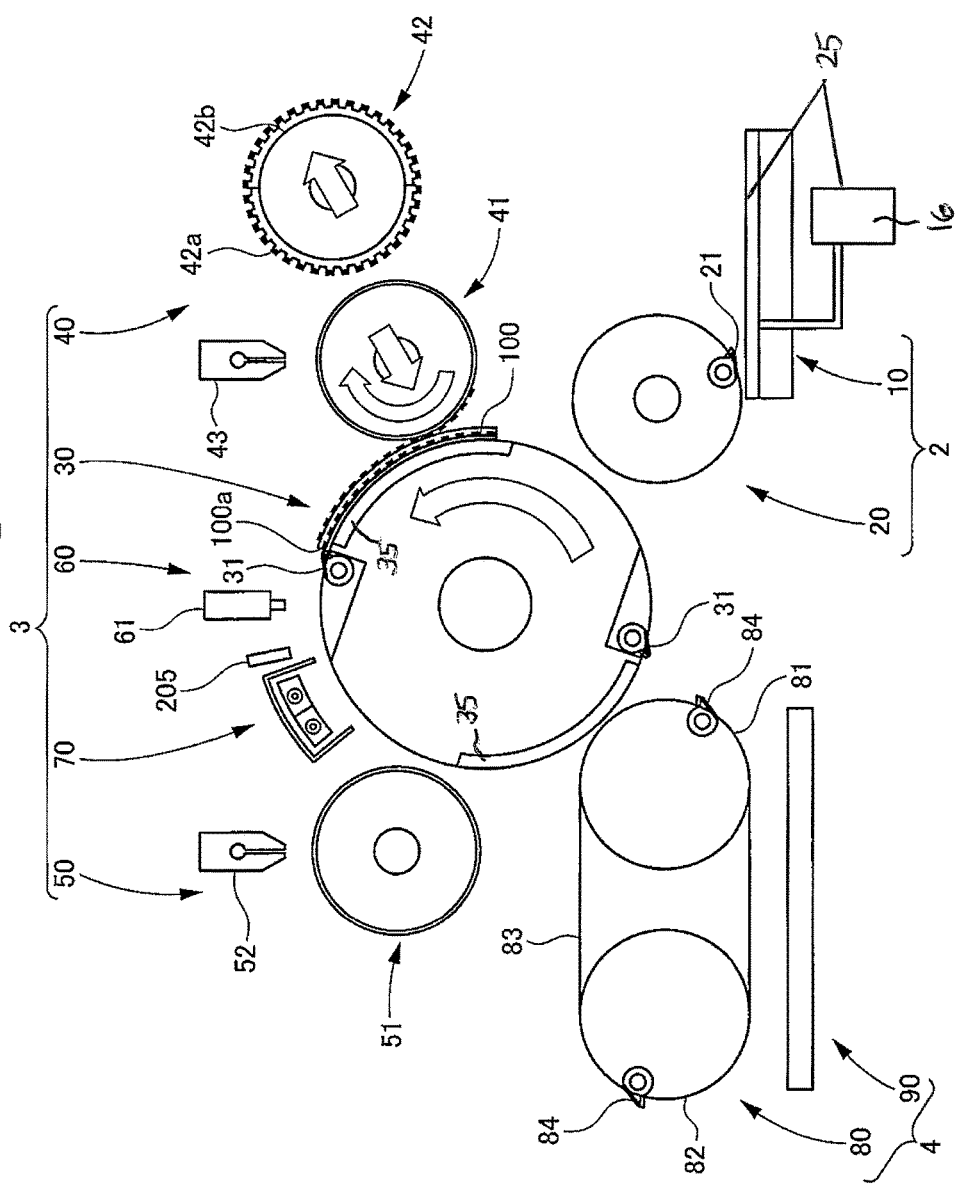
FIG. 7I is an explanatory view showing the operation of the flexible-electronic-device manufacturing apparatus according to the present invention.

Moreover, the slit die 52 of the coating device 50 is configured to be actuated by a coating-section slit-coater actuating device 252 (see FIG. 6). When a process is to be performed by a coating method, the slit die 52 is moved downward and set to a solution feeding position near the rubber cylinder 51, and the insulative solution is fed to the slit die 52 and the rubber cylinder 51 from the insulative-solution feeding device not shown (see FIG. 7E). When no process is to be performed by a coating method, the slit die 52 is moved upward and set to a standby position away from the rubber cylinder 51, and the feed of the insulative solution to the slit die 52 and the rubber cylinder 51 from the insulative-solution feeding device not shown is stopped (see FIG. 7F).

The insulative solution used in the coating device 50 is a solution usable for the formation of the insulating layer 120, and the printing for forming the insulating layer 120 is performed by a coating method using the coating device 50. The insulative solution is not particularly limited to but includes a functional solution in which an insulative material is dissolved and, for example, a functional solution obtained by dissolving polyvinyl phenol into isopropyl alcohol.

The insulative solution is fed from the insulative-solution feeding device not shown into the slit die 52 and then fed from the lower side of the slit die 52 onto the rubber cylinder 51 rotationally driven. The insulative solution fed onto the peripheral surface of the rubber cylinder 51 is applied onto the entire surface of the film substrate 100 held on the impression cylinder 30.

The inkjet printing derive 60 is means for performing one of the multiple processes on the film substrate 100, and is configured to print a semiconductor solution (functional solution) for forming the semiconductor 140 onto the film substrate 100 by using inkjet printing. As shown in FIG. 1, the inkjet printing device 60 includes a nozzle head 61 disposed above the impression cylinder 30 in such a way as to be capable of moving toward and away from the impression cylinder 30, and a semiconductor-solution feeding device not shown.

The inkjet printing device 60 is actuated by an inkjet actuating device 260 (see FIG. 6) such that when a process is to be performed by inkjet printing, the nozzle head 61 is moved downward and set to a printing position near the impression cylinder 30, and the semiconductor solution is fed to the nozzle head 61 and the film substrate 100 from the semiconductor-solution feeding device not shown (see FIG. 7J); when no process is to be performed by inkjet printing, the nozzle head 61 is moved upward and set to a standby positioned away from the impression cylinder 30, and the feed of the semiconductor solution to the nozzle head 61 and the film substrate 100 from the semiconductor-solution feeding device not shown is stopped (see FIG. 7A).

The semiconductor solution used in the inkjet printing device 60 is a solution usable for the formation of the semiconductor 140, and the printing for forming the semiconductor 140 is performed by inkjet printing using the inkjet printing device 60. The semiconductor solution is not particularly limited to but includes a functional solution in which a derivative is dissolved. Examples of the derivative include a polythiophene derivative, a polyacetylene derivative, a polythienylene vinylene derivative, a polyallylamine derivative, an acene derivative, an oligothiphene derivative, and the like, and examples of the solvent include water, alcohol, and the like.

When a process is to be performed by inkjet printing, the semiconductor solution is fed from the semiconductor-solution feeding device not shown into the nozzle heed 61 and then injected from the nozzle head 61 at the printing position onto the film substrate 100. On the other hand, when no process is to be performed by inkjet printing, the feed of the semiconductor solution from the semiconductor-solution feeding device not shown, into the nozzle head 61 is stopped, and the nozzle head 61 is retreated to the standby position.

The drying device 70 is means for performing one of the multiple processes on the film substrate 100, and is configured to apply IR light onto the film substrate 100 having undergone predetermined printing or coating application to thereby remove impurities such as the solvent and dispersant in the functional solution. Here, the functional solution is obtained by dissolving a substance having a conductive function, a conductive function, or the like into a solvent. In this embodiment, the function solution is the conductive solution printed by the reverse printing device 40, the semiconductor solution printed by the inkjet printing device 60, or the insulative solution printed by the coating device 50.

The solidifying device in the present invention is of course not limited to the drying device 70 for applying IR light in this embodiment. Examples of the solidifying device include a drying device configured to dry the above functional solutions, an energy applying device configured to cause cross-linking in the insulative solution which is a functional solution, a calcinating device configured to make conductive the conductive solution which is a functional solution, and the like. In other words, the solidification of the functional solution by the solidifying device can be: drying the printed or applied functional solution by blowing hot air or the like thereto with a heater or the like; calcinating the conductive solution with the film substrate 100 held on the impression cylinder 30 through application of an electron beam (EB), xenon (Xe) flash, or the like; causing cross-linking in the insulative solution and the semiconductor solution with the film substrate 100 held on the impression cylinder 30 through irradiation using a UV lamp in the case where a UV-curable insulative material and a UV-curable organic semiconductor material are employed for the insulative solution and the semiconductor solution, respectively; or the like.

A before-drying-device base-material presence detection sensor 205 (see FIG. 6) is provided near the drying device 70, and is configured to detect the presence of absence of the film substrate 100 before a drying step (solidifying step) by the drying device 70.

Next, the configuration of the base-material discharging unit 4 will be described with reference to FIGS. 1 and 6.

The base-material discharging unit 4 includes: a discharging device 80 configured to receive the film substrate 100 from the impression cylinder 30 of the base-material processing unit 3, and a discharging base 90 on which to place the film substrate 100 discharged by the discharging device 80.

The discharging device 80 includes: one sprocket 81 disposed near the impression cylinder 30 of the base-material processing unit 3; another sprocket 82 disposed on a rear side away from the impression cylinder 30 (left side in FIG. 1); and a chain 83 laid between both sprockets 81 and 82. The chain 83 is provided with gripper bars not shown, and the gripper bars are provided with gripper devices 84.

The sprocket 81 of the discharging device 80 is provided near the impression cylinder 30 of the base-material processing unit 3 and is coupled to the impression cylinder 30 by a gear mechanism not shown. The sprockets 81 and 82 and the chain 83 are configured to be rotationally driven along with the impression cylinder 30. The gripper devices 84 provided to the gripper bars not shown of the chain 83 are each configured to open and close its grippers, i.e. switch between an action for gripping the film substrate 100 end receiving it from the impression cylinder 30 with the grippers and an action for not gripping the film substrate 100 and therefore not receiving it from the impression cylinder 30, by means of a discharging-section-gripper opening-closing-cam driving device 284 (see FIG. 6).

The discharging means in the present invention is not limited to the one including the discharging device 80 in this embodiment. For example, the discharging means may be one including a discharging device employing a separately-drivable sprocket independent of the impression cylinder 30, or one including a mechanism with a transfer cylinder which is interposed between it and the impression cylinder 30 and configured to be driven separately or driven by gear-coupling to the impression cylinder 30.

The grip on the film substrate 100 having undergone the multiple processes in the base-material processing unit 3 is switched from the gripper device 31 of the impression cylinder 30 to one of the gripper devices 84 of the discharging device 80, and the film substrate 100 is transported as the chain 83 of the discharging device 80 is run. As the running of the chain 83 brings the film substrate 100 gripped and held by the gripper devise 84 to a space above the discharging base 90, the grippers of the gripper device 84 open, so that the film substrate 100 is released and placed onto the discharging base 90.

Control on operations performed when the multiple processes are performed in the flexible-electronic-device manufacturing apparatus 1 will be described below.

As shown in FIG. 6, the flexible-electronic-device manufacturing apparatus 1 includes a controlling device 200 as controlling means for controlling the operations performed when the above-described multiple processes are performed.

Moreover, the impression cylinder 30, the rubber cylinder 41 and the reversal place cylinder 42 of the reverse printing device 40, and the rubber cylinder 51 of the coating device 50 are driven independently of each other; thus, to be able to detect their phases, the base-material processing unit 3 includes: an impression-cylinder phase detector 201 as impression-cylinder phase detecting means for detecting the phase of the impression cylinder 30; a reverse-printing-section rubber-cylinder phase detector 202 as rubber-cylinder phase detecting means for detecting the phase of the rubber cylinder 41 the reverse printing device 40; a reverse-printing-section plate-cylinder phase detector 203 as plate-cylinder phase detecting means for defecting the phase of the reversal plate cylinder 42 of the reverse printing device 40; and a coating-section rubber-cylinder phase detector 204 as rubber-cylinder phase detecting means for detecting the phase of the rubber cylinder 51 of the coating device 50 (see FIGS. 1 and 6).

As shown in FIG. 6, the controlling device 200 receives signals from the impression-cylinder phase detector 201, the reverse-printing-section rubber-cylinder phase detector 202, the reverse-printing-section plate-cylinder phase detector 203, and the coating-section rubber-cylinder phase detector 204 as the phases of the cylinders 30, 41, 42, and 51, respectively. Further, the controlling device 200 receives a signal from the before-drying-device base-material presence detection sensor 205 as information on the presence or absence of the film substrate 100 before the drying step.

On the other hand, the controlling device 200 outputs signals as drive instructions to the transfer-cylinder-gripper opening-closing-cam driving device 221, the impression-cylinder driving device 230, the transfer-cylinder-side impression-cylinder-gripper opening-closing-cam driving device 231a, the discharging-section-side impression-cylinder-gripper opening-closing-cam driving device 231b, the reverse-printing-section rubber-cylinder driving-attaching-detaching device 241, the reverse-printing-section plate-cylinder driving-attaching-detaching device 242, the reverse-printing-section slit-coater actuating device 243, the coating-section rubber-cylinder driving-attaching-detaching device 251, the coating-section slit-coater actuating device 252, the inkjet actuating device 260, a drying-device actuating device 270, and the discharging-section-gripper opening-closing-cam driving device 284.

The operation of the flexible-electronic-device manufacturing apparatus 1 according to this embodiment will be described with reference to FIGS. 1 to 7.

First, preparations are made in the base-material feeding unit 2 for the feed of the film substrate 100.

The film substrate 100 is set on the feeding device 10, i.e. the film substrate 100 is placed onto the placing board 13 of the feeding device 10 through a manual operation, for example. In this step, the film substrate 100 is positioned by using contact pins not shown or the like disposed on the placing board 13.

Figure 5A:
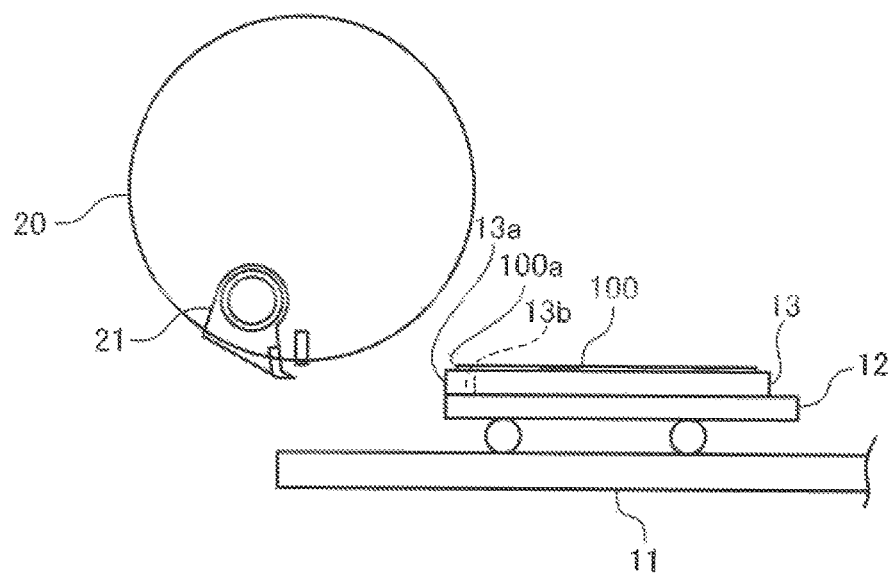
FIG. 5A is an explanatory view showing the operation of the base-material feeding unit in the flexible-electronic-device manufacturing apparatus according to Embodiment 1.
Figure 5B:
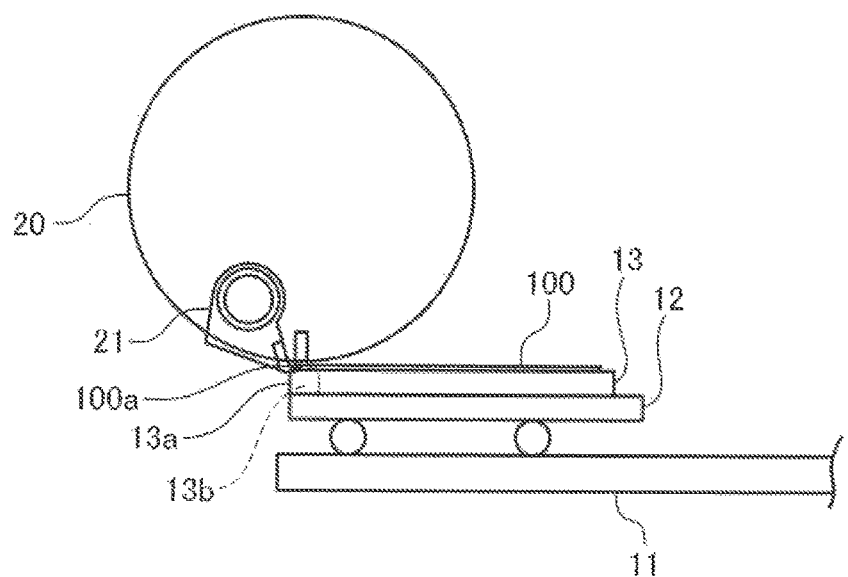
FIG. 5B is an explanatory view showing the operation of the base-material feeding unit in the flexible-electronic-device manufacturing apparatus according to Embodiment 1.
Figure 5C:
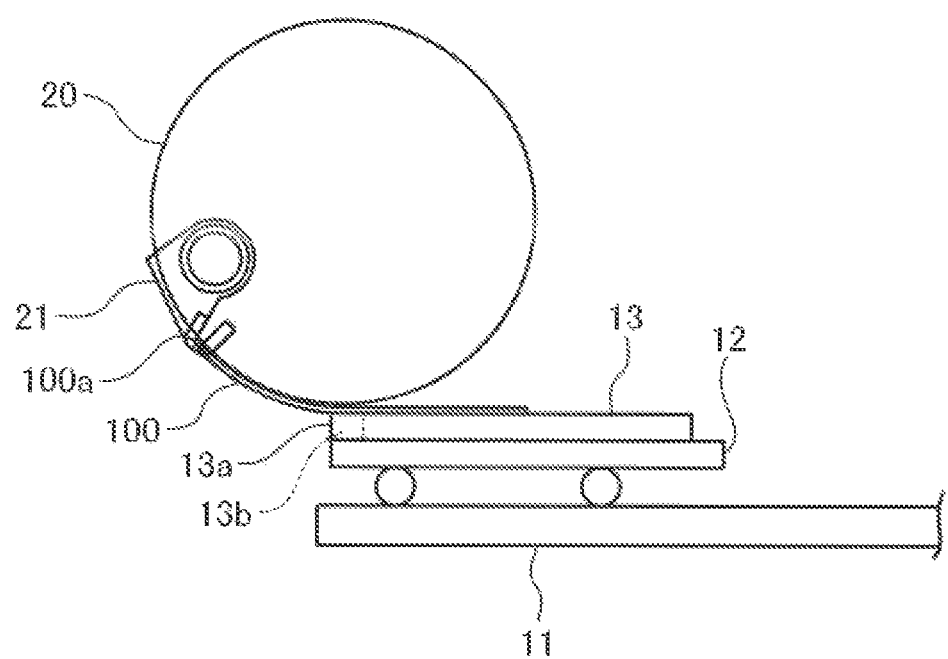
FIG. 5C is an explanatory view showing the operation of the base-material feeding unit in the flexible-electronic-device manufacturing apparatus according to Embodiment 1.

The feeding device 10 with the film substrate 100 placed on the placing board 13 (see FIG. 5A) is moved by a driving device not shown and set to the feeding position near the transfer cylinder 20 (see FIG. 5B).

By the above operation, the preparations for the feed of the film substrate 100 are completed.

Thereafter, the multiple functional layers are printed onto the film substrate 100 in the base-material processing unit 3.

Before the printing, the rubber cylinder 41 of the reverse printing device 40 is set to a detached position away from the impression cylinder 30 by the reverse-printing-section rubber-cylinder driving-attaching-detaching device 241; the plate cylinder 42 of the reverse printing device 40 is set to a detached position away from the rubber cylinder 41 by the reverse-printing-section plate-cylinder driving-attaching-detaching device 242; and the robber cylinder 51 of the coating device 50 is set to a detached position away from the impression cylinder 50 by the coating-section rubber-cylinder driving-attaching-detaching device 251 (see FIG. 7A).

First, in step S1, or the gate-layer forming step, the conductive solution for forming the gate layer 110 is printed and the conductive solution is dried.

The controlling device 200 actuates the reverse-printing-section slit-coater actuating device 243 and the reverse-printing-section rubber-cylinder driving-attaching-detaching device 241 (see FIG. 6). As a result, the conductive solution is fed into the slit die 43 of the reverse printing device 40 by the conductive-solution feeding device not shown and the slit die 43 is moved downward to near the rubber cylinder 41, so that the conductive solution is fed onto the peripheral surface of the rubber cylinder 41 rotationally driven (see FIG. 7A). Once the conductive solution is fed enough onto the peripheral surface of the rubber cylinder 41, the feed of the conductive solution by the conductive-solution feeding device not shown is stopped and the slit die 43 is moved away from the rubber cylinder 41 to the standby position.

Then, the controlling device 200 actuates the reverse-printing-section rubber-cylinder driving-attaching-detaching device 241 and the reverse-printing-section plate-cylinder driving-attaching-detaching device 242 based on the results of detection by the reverse-printing-section rubber-cylinder phase detector 202 and the reverse-printing-section plate-cylinder phase detector 203, respectively (see FIG. 6). As a result, the plate cylinder 42 and the rubber cylinder 41 of the reverse printing device 40 are aligned in phase with a transfer start position of the printing plate 42a on the one side, and the plate cylinder 42 is brought into contact with the rubber cylinder 41; further, the plate cylinder 42 and the rubber cylinder 41 are rotationally driven with a printing pressure applied thereto (see FIG. 7B). As for the conductive solution fed onto the peripheral surface of the rubber cylinder 41, the conductive solution in the negative pattern is removed, by the protruding portions of the printing plate 42a attached to the peripheral surface of the plate cylinder 42, and only the conductive solution in the positive pattern remains (positive patterning).

Once the positive patterning of the conductive solution on the peripheral surface of the rubber cylinder 41 is finished, the controlling device 200 actuates the reverse-printing-section plate-cylinder driving-attaching-detaching device 242, and also actuates the impression-cylinder driving device 230 und the transfer-cylinder-gripper opening-closing-cam driving device 221 based on the result of detection by the impression-cylinder phase detector 201 (see FIG. 6). As a result, the plate cylinder 42 is moved away from the rubber cylinder 41 to the standby position, and the gripper device 21 of the transfer cylinder 20 of the base-material feeding unit 2 grips the film substrate 100 on the placing board 13 of the feeding device 10 (see FIG. 5C). Then, as the impression cylinder 30 is rotationally driven, the transfer cylinder 20 is rotated and thus transports the film substrate 100 (see FIG. 7C).

The controlling device 200 actuates the impression-cylinder driving device 230, the transfer-cylinder-side impression-cylinder-gripper opening-closing-cam driving device 231a, and the transfer-cylinder-gripper opening-closing-cam driving device 221 based on the result of detection by the impression-cylinder phase detector 201 (see FIG. 6). As a result, the grip on the film substrate 100 transported by being gripped by the gripper device 21 of the transfer cylinder 20 is switched to one of the gripper devices 31 of the impression cylinder 30 of the base-material processing unit 3, and the film substrate 100 is transported by the rotation of the impression cylinder 30 (see FIG. 7C).

The controlling device 200 actuates the impression-cylinder driving device 230 and the reverse-printing-section rubber-cylinder driving-attaching-detaching device 241 based on the results of detection by the impression-cylinder phase detector 201 and the reverse-printing-section rubber-cylinder phase detector 202, respectively (see FIG. 6). As a result, the impression cylinder 30 and the rubber cylinder 41 of the reverse printing device 40 are aligned in phase with a transfer start position, and the rubber cylinder 41 is brought into contact with the impression cylinder 30; further, the impression cylinder 30 and the rubber cylinder 41 are rotationally driven with a printing pressure applied thereto (see FIG. 7D). Accordingly, the conductive solution in the positive pattern remaining on the peripheral surface of the rubber cylinder 41 is transferred onto the film substrate 100 held on the peripheral surface of the impression cylinder 30.

By the above operation, the printing of the conductive solution for forming the gate layer on the film substrate 100 is completed.

Then, the conductive solution printed on the film substrate 100 is dried.

The controlling device 200 actuates the impression-cylinder driving device 230 and the drying-device actuating decree 270 based on the results of detection by the impression-cylinder phase detector 201 and the before-drying-device base-material presence detection sensor 205, respectively (see FIG. 6). As a result, the film substrate 100 having undergone the printing by the reverse printing device 40 is transported to near the drying device 70 while kept held on the impression cylinder 30, and the impurities in the conductive solution are removed by the IR light of the drying device 70. During the drying, the impression cylinder 30 is rotationally moved to repeat forward and reverse rotations. In this way, the IR light can be applied thoroughly onto the film substrate 100, thereby making it possible to prevent uneven drying and the like. Meanwhile, the conductive solution may be dried by stopping the impression cylinder 30 for a given amount of time at a drying position at which the IR light is applied.

Also, it is possible to detect improper transport of the film substrate 100 by detecting the presence or absence of the film substrate 100 on the impression cylinder 30 with the before-drying-device base-material presence detection sensor 205. Note that the flexible-electronic-device manufacturing apparatus 1 wall be stopped and a measure will be taken if it is determined by the before-drying-device base-material presence detection sensor 205 that the film substrate 100 is absent.

In this embodiment, the conductive solution printed on the film substrate 100 is dried by applying the IR light onto the film substrate 100 held on the impression cylinder 30. However, the present invention is not limited to this case, and the conductive solution printed on the film substrate 100 may be calcinated while the film substrate 100 is held on the impression cylinder 30.

By the above operation, step S1, or the gate-layer forming step, is completed.

Next, in step S2, or an insulating-layer forming step, the insulative solution for forming the insulating layer 120 is printed and the insulative solution is dried.

The controlling device 300 actuates the coating-section slit-coater actuating device 252 and the coating-section rubber-cylinder driving-attaching-detaching device 251 (see FIG. 6). As s result, the insulative solution is led into the slit die 52 of the coating device 50 by the insulative-solution feeding device not shown and the slit die 52 is moved downward to near the rubber cylinder 51, so that the insulative solution is fed onto the peripheral surface of the rubber cylinder 51 (see FIG. 7E). Once the insulative solution is fed enough onto the peripheral surface of the rubber cylinder 51, the feed of the insulative solution by the insulative-solution feeding device not shown is stopped and the slit die 52 is moved away from the rubber cylinder 51 to the standby position.

In this embodiment, the insulative solution is fed to the slit die 52 and the rubber cylinder 51 of the coating device 50 simultaneously with the drying of the conductive solution. Thus, the efficiency of the operations in the multi-layer printing is improved. The order of the operations in the present invention is of course not limited to the above case, and the order of the operations can be changed without departing from the gist of the present invention.

The controlling device 200 actuates the impression-cylinder driving device 230 and the coating-section rubber-cylinder driving-attaching-detaching device 251 based on the results of defection by the impression-cylinder phase detector 201 and the coating-section rubber-cylinder phase detector 204, respectively (see FIG. 6). As a result, the impression cylinder 30 and the rubber cylinder 51 of the coating device 50 are aligned in phase with a transfer start position, and the rubber cylinder 51 is brought into contact with the impression cylinder 30; further, the impression cylinder 30 and the rubber cylinder 51 are rotationally driven with a printing pressure applied thereto (see FIG. 7E). Accordingly, the insulative solution fed onto the peripheral surface of the rubber cylinder 51 is transferred onto the film substrate 100 held on the peripheral surface of the impression cylinder 30.

By the above operation, the printing of the insulative solution for forming the insulating layer on the film substrate 100 is completed.

Then, the insulative solution printed on the film substrate 100 is dried.

The controlling device 200 actuates, the impression-cylinder driving device 230 and the drying-device actuating device 270 based on the results of detection by the impression-cylinder phase detector 201 and the before-driving-device base-material presence detection sensor 205, respectively (see FIG. 6), As a result, the film substrate 100 having undergone the printing by the coating device 50 is transported to near the drying device 70 while kept held on the impression cylinder 30, and the impurities in the insulative solution are removed by the IR light of the drying device 70. During the drying, the impression cylinder 30 is rotationally moved to repeat forward and reverse rotations. In this way, the IR light can be applied thoroughly onto the film substrate 100, thereby making it possible to prevent uneven drying and the like. Meanwhile, the insulative solution may be dried by stopping the impression cylinder 30 for a given amount of time at the drying position at which the IR light is applied.

Also, it is possible to detect improper transport of the film substrate 100 by detecting the presence or absence of the film substrate 100 on the impression cylinder 30 with the before-drying-device base-material presence detection sensor 205. Note that the flexible-electronic-device manufacturing apparatus 1 will be stopped and a measure will be taken if it is determined by the before-drying-device base-material presence detection sensor 205 that the film substrate 100 is absent.

In this embodiment, the insulative solution printed on the film substrate 100 is dried by applying the IR light onto the film substrate 100 held on the impression cylinder 30. However, the present invention is not limited to this case, and cross-linking may be caused in the insulative solution printed on the film substrate 100 while the film substrate 100 is held on the impression cylinder 30.

By the above operation, step S2, or the insulating-layer forming step, is completed.

Next, in step S3, or the source-drain-layer forming step, the conductive solution for forming the source-drain layer 130 is printed.

The controlling device 200 actuates the impression-cylinder driving device 230 based on the result of detection by the impression-cylinder phase detector 201 (see FIG. 6). As a result, the impression cylinder 30 is rotationally driven in the forward or reverse direction such that the film substrate 100 after the completion of formation of the insulating layer 120 stopped at a preparation position for the source-drain-layer forming step. Note that in the case of moving the film substrate 100 by rotationally driving the impression cylinder 30 in the forward direction, the controlling derive 200 actuates the discharging-section-side impression-cylinder-gripper opening-closing-cam driving device 231b such that the grip on the film substrate 100 will be not switched from the impression cylinder 30 to the discharging device 80 of the base-material discharging unit 4.

The controlling device 200 actuates the reverse-printing-section slit-coater actuating device 243 and the reverse-printing-section rubber-cylinder driving-attaching-detaching device 241 (see FIG. 6). As a result, the conductive solution is fed into the slit die 43 of the reverse printing device 40 by the conductive-solution feeding device no shown, and the slit die 43 is moved downward to near the rubber cylinder 41, so that the conductive solution is fed onto the peripheral surface of the rubber cylinder 41 rotationally driven (see FIG. 7G). Once the conductive solution is fed enough onto the peripheral surface of the rubber cylinder 41, the feed of the conductive solution by the conductive-solution feeding device not shown is stopped and the slit die 43 is moved away from the rubber cylinder 41 to the standby position.

Then, the controlling device 200 actuates the reverse-printing-section rubber-cylinder driving-attaching-detaching device 241 and the reverse-printing-section plate-cylinder driving-attaching-detaching device 242 based on the results of detection by the reverse-printing-section rubber-cylinder phase detector 202 and the reverse-printing-section plate-cylinder phase detector 203, respectively (see FIG. 6). As a result, the plate cylinder 42 and the rubber cylinder 41 of the reverse printing device 40 are aligned in phase with a transfer start position of the printing plate 42b on the other side, and the plate cylinder 42 is brought into contact with the rubber cylinder 41; further, the plate cylinder 42 and the rubber cylinder 41 are rotationally driven with a printing pressure applied thereto (sea FIG. 7H). As for the conductive solution fed onto the peripheral surface of the rubber cylinder 41, the conductive solution in the negative pattern is removed by the protruding portions of the printing plate 42b attached to the peripheral surface of the plate cylinder 42, and only the conductive solution in the positive pattern remains (positive patterning).

Once the positive patterning of the conductive solution on the peripheral surface of the rubber cylinder 41 is finished, the controlling device 200 actuates the reverse-printing-section plate-cylinder driving-attaching-detaching device 242, and also actuates the impression-cylinder driving device 230 and the reverse-printing-section rubber-cylinder driving-attaching-detaching device 241 based on the results of detection by the impression-cylinder phase detector 201 and the reverse-printing-section rubber-cylinder phase detector 202, respectively (see FIG. 6). As a result, the plate cylinder 42 is moved away from the rubber cylinder 41 to the standby position; also, the impression cylinder 30 and the rubber cylinder 41 of the reverse printing device 40 are aligned, in phase with a transfer start position, and the rubber cylinder 41 is brought into contact with the impression cylinder 30; further, the impression cylinder 30 and the rubber cylinder 41 are rotationally driven with a printing pressure applied thereto (see FIG. 7I). Accordingly, the conductive solution in the positive pattern remaining on the peripheral surface of the rubber cylinder 41 is transferred onto the film substrate 100 held on the peripheral surface of the impression cylinder 30.

By the above operation, the printing of the conductive solution for forming the source-drain layer on the film substrate 100 is completed.

Then, the conductive solution printed on the film substrate 100 is dried.

The controlling device 200 actuates the impression-cylinder driving device 230 and the drying-device actuating device 270 based on the results of detection by the impression-cylinder phase detector 201 and the before-drying-device base-material presence detection sensor 205, respectively (see FIG. 6). As a result, the film substrate 100 having undergone the printing by the reverse printing device 40 is transported to near the drying device 70 while kept held on the impression cylinder 30, and the impurities in the conductive solution are removed by the IR light of the drying device 70. During the drying, the impression cylinder 30 is rotationally moved to repeat forward and reverse rotations. In this way, the IR light can be applied thoroughly onto the film substrate 100, thereby making it possible to prevent uneven drying and the like. Meanwhile, the conductive solution may be dried by stopping the impression cylinder 30 for a given amount of time at the drying position at which the IR light is applied.

Also, it is possible to detect improper transport of the film substrate 100 by detecting the presence or absence of the film substrate 100 on the impression cylinder 30 with the before-drying-device base-material presence detection sensor 205. Note that the flexible-electronic-device manufacturing apparatus 1 will be stopped and a measure will be taken if it is determined by the before-drying-device base-material presence detection sensor 205 that the film substrate 100 is absent.

In this embodiment, the conductive solution printed on the film substrate 100 is dried by applying the IR light onto the film substrate 100 held on the impression cylinder 30. However, the present invention is not limited to this case, and the conductive solution printed on the film substrate 100 may be calcinated while the film substrate 100 is held on the impression cylinder 30.

By the above operation, step S3, or the source-drain-layer forming step, is completed.

Next, in step S4, or a semiconductor forming step, the semiconductor solution for forming the semiconductor 140 is printed.

The controlling device 200 actuates the impression-cylinder driving device 230 based on the result of defection by the impression-cylinder phase detector 201 (see FIG. 6). As a result, the impression cylinder 30 is rotationally driven in the forward or reverse direction such that the film substrate 100 after the completion of formation of the source-drain layer 130 is stopped at a preparation position for the semiconductor forming step. Note that in the case of moving the film substrate 100 by rotationally driving the impression cylinder 30 in the reverse direction, the controlling device 200 actuates the discharging-section-side impression-cylinder-gripper opening-closing-cam driving device 231b such that the grip on the film substrate 100 will be not switched from the impression cylinder 30 to the discharging device 80 of the base-material discharging unit 4.

The controlling device 200 actuates the impression-cylinder driving device 230 and the inkjet actuating device 260 based on the result of detection by the impression-cylinder phase detector 201 (see FIG. 6). As a result, the nozzle head 61 of the inkjet printing device 60 is moved downward to near the impression cylinder 30, the semiconductor solution is fed into the nozzle head 61 by the semiconductor-solution feeding device not shown, and the film substrate 100 held on the peripheral surface of the impression cylinder 30 is printed by inkjet printing (see FIG. 7J). Once the film substrate 100 is printed by inkjet printing, the feed of the semiconductor solution into the nozzle head 61 from the semiconductor-solution feeding device not shown is stopped, and the nozzle head 61 is moved away from the impression cylinder 30 to the standby position.

By the above operation, the printing of the semiconductor solution for forming the semiconductor 140 on the film substrate 100 is completed.

Then, the semiconductor solution printed on the film substrate 100 is dried.

The controlling device 200 actuates the impression-cylinder driving device 230 and the drying-device actuating device 270 based on the results of detection by the impression-cylinder phase detector 201 and the before-drying-device base-material presence detection sensor 205, respectively (see FIG. 6). As a result, the film substrate 100 having undergone the printing by the inkjet printing device 60 is transported to near the drying device 70 while kept held on the impression cylinder 30, and the impurities in the semiconductor solution are removed by the IR light of the drying device 70. During the drying, the impression cylinder 30 is rotationally moved to repeat forward and reverse rotations. In this way, the IR light can be applied thoroughly onto the film substrate 100, thereby making it possible to prevent uneven drying and the like. Meanwhile, the semiconductor solution may be dried by stopping the impression cylinder 30 for a given amount of time at the drying position at which the IR light is applied.

Also, it is possible to detect improper transport of the film substrate 100 by detecting the presence or absence of the film substrate 100 on the impression cylinder 30 with the before-drying-device base-material presence detection sensor 205. Note that the flexible-electronic-device manufacturing apparatus 1 will be stopped and a measure will be taken if it is determined by the before-drying-device base-material presence detection sensor 205 that the film substrate 100 is absent.

In this embodiment, the semiconductor solution printed on the film substrate 100 is dried by applying the IR light onto the film substrate 100 held on the impression cylinder 30. However, the present invention is not limited to this case, and cross-linking may be caused in the semiconductor solution printed on the film substrate 100 while the film substrate 100 is held on the impression cylinder 30.

By the above operation, step S4, or the semiconductor forming step, is completed.

Figure 3:
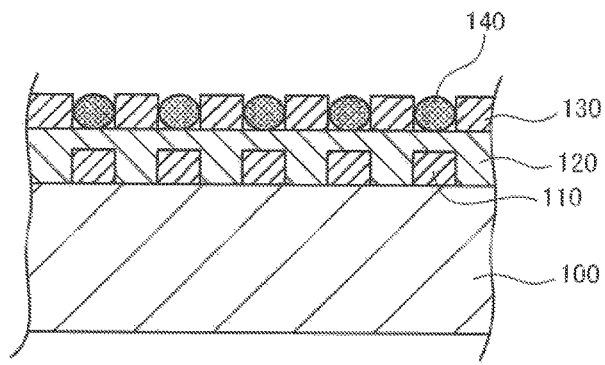
FIG. 3 is a partially-enlarged cross-sectional view of a film substrate having undergone multiple processes in the flexible-electronic-device manufacturing apparatus according to the present invention.

By the above steps, the multi-layer printing of the functional layers onto the film substrate 100 in the base-material processing unit 3 is completed, so that the film substrate 100 on which the gate layer 110, the insulating layer 120, the source-drain layer 130, and the semiconductor 110 are accurately stacked as shown in FIG. 3 is obtained.

Thereafter, the film substrate 100 is discharged in the base-material discharging unit 4.

The controlling device 200 actuates the impression-cylinder driving device 230, the discharging-section-side impression-cylinder-gripper opening-closing-cam driving device 231b, and the discharging-section-gripper opening-closing-cam driving device 284 based on the result of detection by the impression-cylinder phase detector 201 (see FIG. 6). As a result, the grip on the film substrate 100 transported by being gripped by the gripper device 31 of the impression cylinder 30 is switched to the gripper device 84 of the discharging device 80 of the base-material discharging unit 4, and the sprocket 81 is rotationally driven by the rotational drive of the impression cylinder 30, thereby running the chain 83 and thus transporting the film substrate 100.

Once transported to the space above the discharging base 90 by the discharging device 80, the film substrate 100 is released from the gripper device 84 and placed onto the discharging base 90, so that the discharge of the film substrate 100 is completed.

In this embodiment, calcination and cross-linking of the gate layer 110, the insulating layer 120, the source-drain layer 130, and the semiconductor 140 printed as multiple layers on the film substrate 100 are performed in the oven not shown, which is separate from the flexible-electronic-device manufacturing apparatus 1. As a result, an electronic device is obtained in which the gate layer 110, the insulating layer 120, the source-drain layer 130, and the semiconductor 140 are accurately stacked on the film substrate 100 as functional layers.

The flexible-electronic-device manufacturing apparatus according to the present invention is of course not limited to one like this embodiment that involves calcination and cross-linking in a separate oven. It is possible to employ a configuration in which an oven is disposed in the base-material processing unit 3 of the flexible-electronic-device manufacturing apparatus 1 and the calcination and cross-linking of the functional layers are performed in the flexible-electronic-device manufacturing apparatus 1.

According to the flexible-electronic-device manufacturing apparatus according to this embodiment, all the necessary processes can be performed on the base material in one flexible-electronic-device manufacturing apparatus. Thus, a one-pass operation by only feeding the base material after simple positioning.

Moreover, the flexible-electronic-device manufacturing apparatus according to the present invention is not limited to one like this embodiment configured to print the four layers of the gate layer 110, the insulating layer 120, the source-drain layer 130, and the semiconductor 140 at once. For example, it is possible to discharge the film substrate 100 after printing the gate layer 110, perform a different process in a separate processing device, bring the film substrate 100 back to the flexible-electronic-device manufacturing apparatus 1, and then print the remaining insulating layer 120, source-drain layer 130, and semiconductor 140.

{Embodiment 2}

A flexible-electronic-device manufacturing apparatus according to this embodiment has the same configuration as the flexible-electronic-device manufacturing apparatus according to Embodiment 1 described above, except the configuration of the feeding device 10 of the base-material feeding unit 2. Specifically, the flexible-electronic-device manufacturing apparatus according to this embodiment has the same configuration except that the feeding device 10 has a function to adjust the alignment of the film substrate 100. More that the same parts of the configuration as those in Embodiment 1 will be denoted by the same reference signs to omit overlapping description thereof as appropriate.

The flexible-electronic-device manufacturing apparatus according to this embodiment will be described with reference to FIGS. 1 to 3.

The flexible-electronic-device manufacturing apparatus according to this embodiment is configured to accurately adjust the alignment of a base material and then perform multiple processes on the base material for manufacturing a flexible electronic device.

Like Embodiment 1, a flexible-electronic-device manufacturing apparatus 1 includes a base-material feeding unit 2, a base-material processing unit 3, and a base-material discharging unit 4, and the base-material feeding unit 2 includes a transfer cylinder 20 and a feeding device 10 (see FIG. 1.

The feeding device 10 in this embodiment includes a transporting table 12 and a placing board 13 and further includes an actuator 14 as position adjusting means having a function to adjust the alignment of a film substrate 100, i.e. being capable of adjusting the position of the placing board 13 relative to the transporting table 12 (see FIG. 3).

By actuating the actuator 14, the placing board 13 can be moved in a left-right direction X and a top-bottom direction Y and rotated in a rotational direction θ along a horizontal plane on the transporting table 12. In other words, the placed position of the film substrate 100 relative to the transporting table 12 can be adjusted through positional adjustment by the actuator 14 in the left-right direction X, the top-bottom direction Y, and the rotational direction θ.

The base-material feeding unit 2 is provided with sucking means 25 for sucking the film substrate 100 onto the placing board 13 so as to prevent changes in the placed position of the film substrate 100 on the placing board 13 even when the transporting table 12 is moved on the transporting base 11. In this embodiment, as the sucking means 25, multiple suction holes not shown are provided which have openings at the surface of the placing board 13 which comes into contact with the film substrate 100, and a pump 16 is provided as well which communicates with the suction holes and applies negative pressure (see FIG. 10). In other words, the sucking means 25 in this embodiment is configured to utilize negative pressure for vacuum suction of the film substrate 100 onto the placing board 13.

By providing the suction holes (not shown) and the pump 16 as described above, the film substrate 100 can be sucked onto the placing board 13 by utilizing the negative pressure generated by the pump 16. Specifically, the negative pressure generated by the pump 16 is applied to the film substrate 100 on the placing board 13 through the suction holes (not shown) communicating with the pump 16, so that the film substrate 100 is sucked onto the placing board 13. In this way, the placed position of the film substrate 100 on the placing board 13 is not changed even when the transporting table 12 is moved on the transporting base 11. Accordingly, the placed position of the film substrate 100 can be adjusted precisely and finely.

Meanwhile, a controlling device 200 receives information on the operator's operation on a suction switch 206. Moreover, the controlling device 200 outputs information for starting or finishing the suction of the film substrate 100 onto the placing board 13 to the pump 16.

Furthermore, alignment cameras 15 as position detecting means for detecting the placed position of the film substrate 100 relative to the transporting table 12 are disposed above the moving path of the transporting table 12. By providing the actuator 14 and the alignment cameras 15 as described above, accurate alignment adjustment can be done for the placed position of the film substrate 100 relative to the transporting table 12.

Specifically, the transporting table 12 on which the film substrate 100 is set is stopped at an alignment adjusting position at which the alignment cameras 15 are disposed (see FIG. 9A), and the alignment cameras 15 read alignment marks 101 (cross marks in this embodiment) provided in advance on the film substrate 100 to detect the placed position of the film substrata 100 relative to the transporting table 12, and the actuator 14 is actuated based on the result of the detection. In this way, the alignment marks 101, i.e. the film substrate 100 can be set to a predetermined position (a reference position relative to the transporting table 12) (see FIG. 8).

In this operation, the pump 16 is actuated to suck the film substrate 100 onto the placing board 13, and therefore the placed position of the film substrate 100 can be adjusted precisely and finely, i.e. the alignment of the film substrate 100 can be adjusted accurately.

By accurately adjusting the alignment of the film substrate 100 as described above, the film substrate 100 can be fed at a predetermined feeding position onto the transfer cylinder 20 and transported at a predetermined transporting position to the base-material processing unit 3. In this way, in the base-material processing unit 3, various processes can be performed on the film substrate 100 which is transported always at the predetermined transporting position. Accordingly, the various processes can be performed accurately on the film substrate 100.

Moreover, for example, various processes can be preformed accurately even on a base material having undergone a given process in a previous step, by performing the above-described alignment adjustment in the flexible-electronic-device manufacturing apparatus 1 according to this embodiment. In addition, even after the various processes in the flexible-electronic-device manufacturing apparatus 1, alignment adjustment similar to that in this embodiment can be performed in a different processing device based on the existing alignment marks 101. In this way, the different processing device can perform the different process accurately.

Moreover, as described above, the alignment of the film substrate 100 can be adjusted accurately in the feeding device 10; thus, the film substrate 100 does not need to be placed precisely at the predetermined position, and only needs to be roughly positioned by using contact pins not shown or the like disposed on the placing board 13 when the film substrate 100 is set on the feeding device 10, i.e. when the film substrate 100 is placed on the placing board 13 of the feeding device 10.

In sum, the film substrate 100 may be roughly positioned on the placing board 13 through a manual operation, for example; then, the film substrate 100 may be sucked onto the placing board 13 and precisely positioned on the placing board 13 through the above-described alignment adjustment (set at the reference position relative to the transporting table 12). In this way, for the setting of the film substrate 100 onto the feeding device 10, the burden on the operator does not increase and the manufacturing man-hours do therefore not increase either.

The actuator 14 for driving the placing board 13 of the feeding device 10, i.e. the position adjusting means for the film substrate 100 only needs to be configured to be capable of moving the placing board 13 in two different directions and rotating the placing board 13 relative to the transporting table 12 along a horizontal plane. It is possible to employ various mechanisms such, for example, as a mechanism including a drive source such as a motor connected through a ball screw, a bearing, and the like, and a mechanism using hydraulic pressure, air pressure, or the like.

Note that the transporting table 12 in this embodiment is configured to be capable of moving between a base-material setting position (not shown) for placing the film substrate 100 onto the placing board 13, the alignment adjusting position (see FIG. 9A) for detecting and adjusting the placed position of the film substrate 100, and the feeding position (see FIG. 9B) for a gripper device 21 of the transfer cylinder 20 to grip the film substrate 100, and its movement mechanism, drive source, and the like are not particularly limited. In order to accurately move the transporting table 12, i.e. the film substrate 100 from the alignment adjusting position to the feeding position, it is preferable to use a linear motor not shown or the like to linearly drive the transporting table 12.

The base-material setting position, the alignment adjusting position, and the feeding position mentioned above may of course be the same single position, and the setting of the film substrate 100, the detection and adjustment of the placed position of the film substrate 100, and the feed of the film substrate 100 to the gripper device 21 of the transfer cylinder 20 may be performed without moving the transporting table 12.

The actuator 14 and the alignment cameras 15 in this embodiment are electrically connected to the controlling device 200. Specifically, as shown in FIG. 10, the controlling device 200 receives information on the placed position of the film substrate 100 relative to the transporting table 12 which is detected by the alignment cameras 15 of the base-material feeding unit 2, in addition to the information received in Embodiment 1; and the controlling device 200 outputs information for adjusting the placed position of the film substrate 100 relative to the transporting table 12 to the actuator 14, in addition to the information outputted in Embodiment 1.

Preparations for the feed of the film substrate 100 in the base-material feeding unit 2 in the operation of the flexible-electronic-device manufacturing apparatus 1 according to this embodiment will be described with reference to FIGS. 8 to 10. Note that the operations of the base-material processing unit 3 and the base-material discharging unit 4 are the same as those in Embodiment 1.

The film substrate 100 is set on the feeding device 10, i.e. the film substrate 100 is placed on the placing board 13 of the feeding device 10 through a manual operation, for example. In this step, the film substrate 100 is roughly positioned by using the contact pins not shown or the like disposed on the placing board 13.

The operator operates the suction switch 206 to start the suction of the film substrate 100 onto the placing board 13. When the controlling device 200 receives the information to start the suction from the suction switch 206, the controlling device 200 controls the operation of the pump 16 such that the film substrate 100 is sucked onto the placing board 13 through the suction holes not shown. Specifically, a valve not shown provided inside or outside the pump 16 is opened or closed to control the suction of the film substrate 100 onto the placing board 13.

More specifically, to start the suction, the valve not shown is closed so that the negative pressure by the pump 16 will be applied to the film substrate 100 through the suction holes not shown; to finish the suction, the valve is opened so that the negative pressure by the pump 16 will not be applied to the film substrate 100 through the suction holes not shown.

The sucking means 25 in the present invention is not limited to one like this embodiment configured to start the suction of the film substrate 100 onto the placing board 13 upon the operator's operation on the suction switch 206. For example, a detection sensor (not shown) configured to detect the presence of the film substrate 100 on the placing board 13 may be provided, and the suction may be started automatically when the operator roughly positions the film substrate 100 on the placing board 13 through an manual operation, for example.

The sucking means 25 in the present invention is not limited to one like this embodiment configured to start and finish the suction of the film substrate 100 onto the placing board 13 by closing and opening the valve (not shown). For example, the pump 16 may be turned on and off to start and finish the suction of the film substrate 100 onto the placing board 13.

Figure 9A:
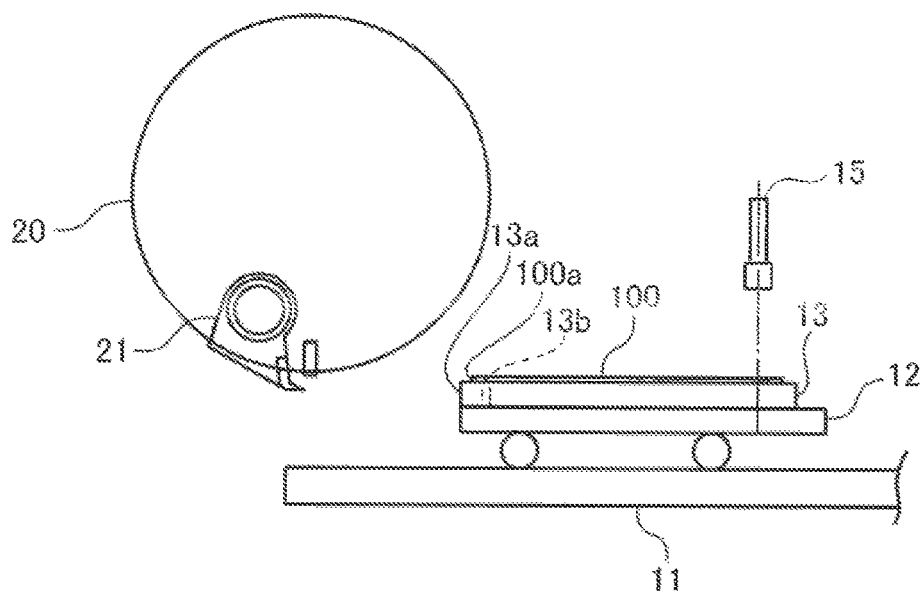
FIG. 9A is an explanatory view showing the operation of the base-material feeding unit in the flexible-electronic-device manufacturing apparatus according to Embodiment 2.

The feeding device 10 with the film substrate 100 sucked onto the placing board 13 is moved by a driving device not shown and set to the alignment adjusting position around where the alignment cameras 15 are disposed (see FIG. 9A). Then, the controlling device 200 controls the actuator 14 based on the result of detection by the alignment cameras 15 such that the film substrate 100 will be fed at the predetermined position to the base-material processing unit 3 (see FIG. 10).

Figure 8:
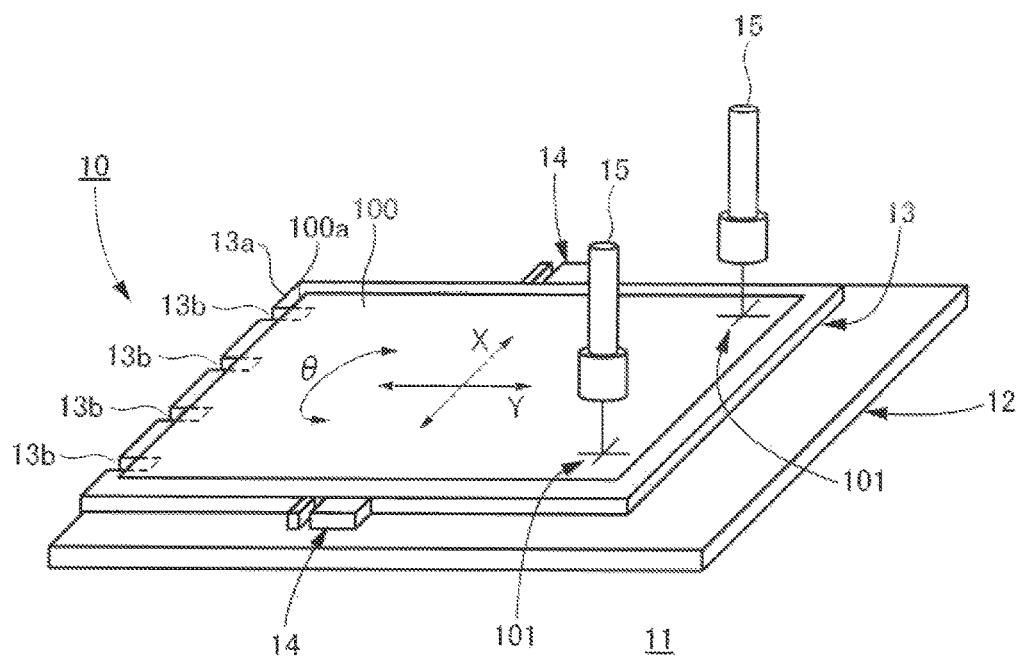
FIG. 8 is a schematic perspective view showing a feeding device of a base-material feeding unit in a flexible-electronic-device manufacturing apparatus according to Embodiment 2.

At the alignment adjusting position, the alignment cameras 15 read the alignment marks 101 provided in advance on the film substrate 100 to detect the placed position of the film substrate 100 relative to the transporting table 12 (see FIG. 8). The actuator 14 is operated based on the result of the detection to move the placing board 13 in the two different directions X and Y and rotate it in the rotational direction θ along a horizontal plane. In other words, the placing board 13 is operated through a combination of movement in the left-right direction X, movement in the top-bottom direction Y, and rotation in the rotational direction θ along the horizontal plane to set the alignment marks 101, i.e. the film substrate 100 to the predetermined position (the reference position relative to the transporting table 12).

Figure 9B:
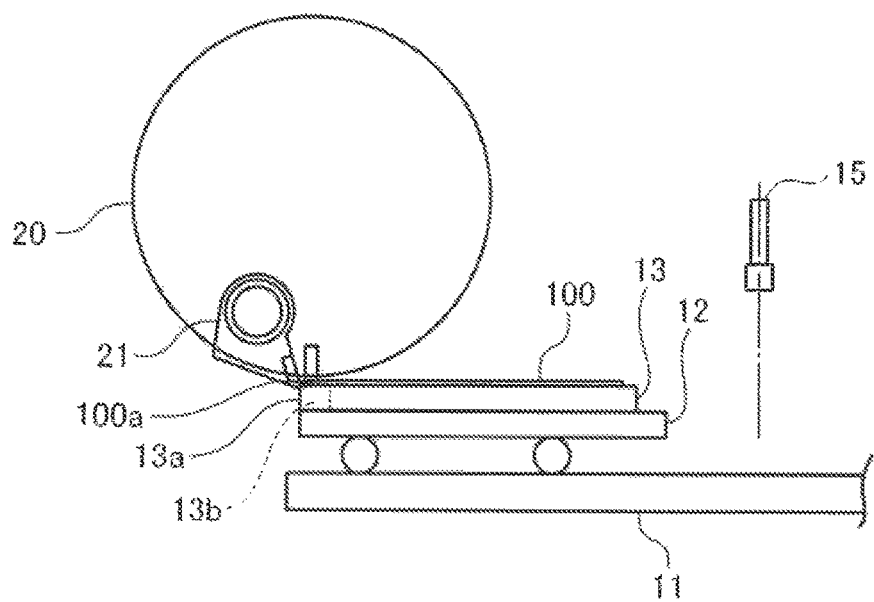
FIG. 9B is an explanatory view showing the operation of the base-material feeding unit in the flexible-electronic-device manufacturing apparatus according to Embodiment 2.
Figure 9C:
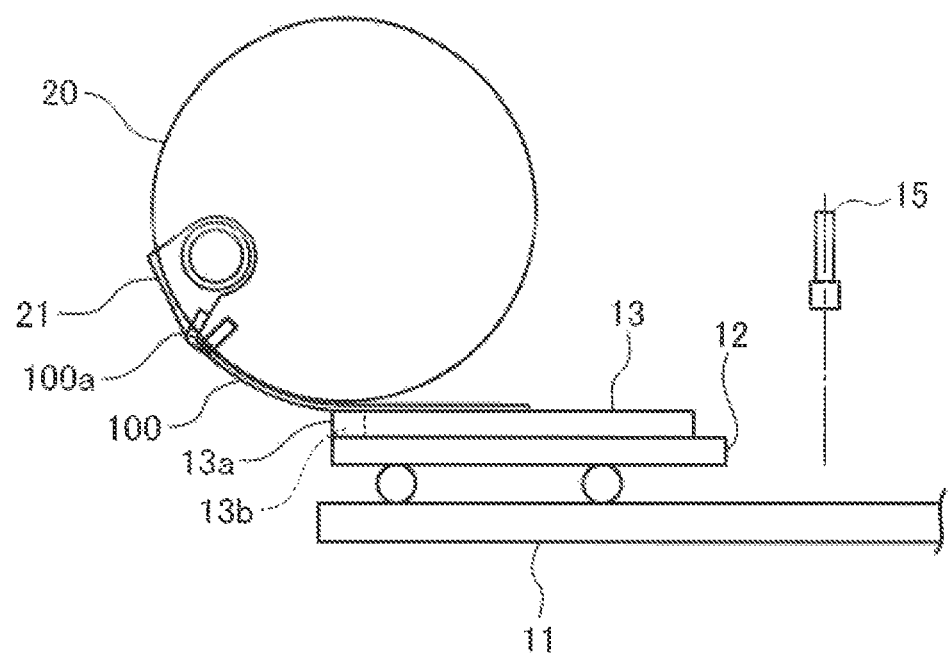
FIG. 9C is an explanatory view showing the operation of the base-material feeding unit in the flexible-electronic-device manufacturing apparatus according to Embodiment 2.

Once the film substrate 100 is positioned precisely relative to the transporting table 12, the feeding device 10 is moved further by the driving device not shown and set to the feeding position near the transfer cylinder 20 (see FIG. 9B).

By the above operation, the preparations for the feed of the film substrate 100 are completed.

Thereafter, the film substrate 100 transported by the feeding device 10 to the feeding position is gripped and held at its transporting-direction upstream end portion 100a by the gripper device 21 provided to the transfer cylinder 20. The film substrate 100 is then transported by rotational movement of the transfer cylinder 20 (see FIG. 9C) and fed to the base-material processing unit 3.

Note that the controlling device 200 actuates an impression-cylinder driving device 230 and a transfer-cylinder-gripper opening-closing-cam driving device 221 based on the result of detection by an impression-cylinder phase detector 201. Also, the controlling device 200 finishes the suction of the film substrate 100 onto the placing board 13 substantially at the same time as this, i.e. substantially at the same time as when the gripper device 21 of the transfer cylinder 20 of the base-material feeding unit 2 grips the film substrate 100 on the placing board 13 of the feeding device 10.

In other words, the valve not shown presided inside or outside the pump 16 is opened to stop the negative pressure by the pump 16 from being applied to the film substrate 100 through the suction holes not shown. As a result, the film substrate 100 is released from the suction on the placing board 13 by the negative pressure of the pump 16, and becomes capable of being transported by the transfer cylinder 20.

Thereafter, like Embodiment 1, multi-layer printing of functional layers onto the film substrate 100 is performed in the base-material processing unit 3, and the film substrate 100 is discharged in the base-material discharging unit 4. As a result, a film substrate 100 is obtained on which a gate layer 110, an insulating layer 120, a source-drain layer 130, and a semiconductor 140 are accurately stacked.

Then, like Embodiment 1, calcination and cross-linking of the gate layer 110, the insulating layer 120, the source-drain layer 130, and the semiconductor 140 printed as multiple layers on the film substrate 100 are performed in an oven not shown, which is separate from the flexible-electronic-device manufacturing apparatus 1. As a result, an electronic device is obtained in which the gate layer 110, the insulating layer 120, the source-drain layer 130, and the semiconductor 140 are accurately stacked on the film substrate 100 as functional layers.

The flexible-electronic-device manufacturing apparatus according to the present invention is of course not limited to one like this embodiment that involves calcination and cross-linking in a separate oven. It is possible to employ a configuration in which an oven is disposed in the base-material processing unit 3 of the flexible-electronic-device manufacturing apparatus 1 and the calcination and cross-linking of the functional layers are performed in the flexible-electronic-device manufacturing apparatus 1.

Moreover, the flexible-electronic-device manufacturing apparatus according to the present invention is not limited to one like this embodiment configured to print the four layers of the gate layer 110, the insulating layer 120, the source-drain layer 130, and the semiconductor 140 at once. For example, it is possible to discharge the film substrate 100 after printing the gate layer 110, perform a different process in a separate processing device, bring the film substrate 100 back to the flexible-electronic-device manufacturing apparatus 1, and then print the remaining insulating layer 120, source-drain layer 130, and semiconductor 140.

According to the flexible-electronic-device manufacturing apparatus 1 according to this embodiment, it is possible to accurately adjust the alignment of the base material and then perform the multiple processes for manufacturing an electronic device. Thus, even if a process has been performed on the film substrate 100 in advance in a different processing device not shown, other processes can further be performed accurately on that film substrate 100 in the base-material processing unit 3 by adjusting the alignment thereof in the base-material feeding unit 2. Moreover, even after the multiple processes by the flexible-electronic-device manufacturing apparatus 1, the reference points (alignment marks 101) based on which the processes have been performed on the film substrate 100 can be found; thus, a different process can be performed accurately by a different processing device not shown by adjusting the alignment based on the reference points in the different processing device.

REFERENCE SIGNS LIST

1 FLEXIBLE-ELECTRONIC-DEVICE MANUFACTURING APPARATUS
2 BASE-MATERIAL FEEDING UNIT (FEEDING MEANS)
3 BASE-MATERIAL PROCESSING UNIT
4 BASE-MATERIAL DISCHARGING UNIT (DISCHARGING MEANS)
10 FEEDING DEVICE
11 TRANSPORTING BASE
12 TRANSPORTING TABLE
13 PLACING BOARD (PLACING MEANS)
13a TRANSPORTING-DIRECTION UPSTREAM END PORTION OF PLACING BOARD
13b NOTCHED PORTION OF PLACING BOARD
14 ACTUATOR (POSITION ADJUSTING MEANS)
15 ALIGNMENT CAMERA (POSITION DETECTING MEANS)
16 PUMP (SUCKING MEANS)
20 TRANSFER CYLINDER (TRANSPORTING MEANS)
21 GRIPPER DEVICE OF TRANSFER CYLINDER
30 IMPRESSION CYLINDER
31 GRIPPER DEVICE OF IMPRESSION CYLINDER
40 REVERSE PRINTING DEVICE (PROCESSING MEANS, PRINTING DEVICE)
41 RUBBER CYLINDER
42 REVERSAL PLATE CYLINDER
43 SLIT DIE
50 COURTING DEVICE (PROCESSING MEANS, COATING APPLYING DEVICE)
51 RUBBER CYLINDER
52 SLIT DIE
60 INKJET PRINTING DEVICE (PROCESSING MEANS, PRINTING DEVICE)
61 NOZZLE HEAD
70 DRYING DEVICE (PROCESSING MEANS, SOLIDIFYING DEVICE)
80 DISCHARGING DEVICE
81 SPROCKET
82 SPROCKET
83 CHAIN
84 GRIPPER DEVICE OF DISCHARGING DEVICE
90 DISCHARGING BASE
100 FILM SUBSTRATE
101 ALIGNMENT MARK
110 GATE LAYER
120 INSULATING LAYER
130 SOURCE-DRAIN LAYER
140 SEMICONDUCTOR
200 CONTROLLING DEVICE
201 IMPRESSION-CYLINDER PHASE DETECTOR (IMPRESSION-CYLINDER PHASE DETECTING MEANS)

202 REVERSE-PRINTING-SECTION RUBBER-CYLINDER PHASE DETECTOR (RUBBER-CYLINDER PHASE DETECTING MEANS)
203 REVERSE-PRINTING-SECTION PLATE-CYLINDER PHASE DETECTOR (PLATE-CYLINDER PHASE DETECTING MEANS)
204 COATING-SECTION RUBBER-CYLINDER PHASE DETECTOR (RUBBER-CYLINDER PHASE DETECTING MEANS)
205 BEFORE-DRYING-DEVICE BASE-MATERIAL PRESENCE DETECTION SENSOR
206 SUCTION SWITCH
221 TRANSFER-CYLINDER-GRIPPER OPENING-CLOSING-CAM DRIVING DEVICE
230 IMPRESSION-CYLINDER DRIVING DEVICE (IMPRESSION-CYLINDER DRIVING MEANS)
231a TRANSFER-CYLINDER-SIDE IMPRESSION-CYLINDER-GRIPPER OPENING-CLOSING-CAM DRIVING DEVICE
231b DISCHARGING-SECTION-SIDE IMPRESSION-CYLINDER-GRIPPER OPENING-CLOSING-CAM DRIVING DEVICE
241 REVERSE-PRINTING-SECTION RUBBER-CYLINDER DRIVING-ATTACHING-DETACHING DEVICE (RUBBER-CYLINDER DRIVING MEANS AND RUBBER-CYLINDER ATTACHING-DETACHING MEANS)
242 REVERSE-PRINTING-SECTION PLATE-CYLINDER DRIVING-ATTACHING-DETACHING DEVICE (PLATE-CYLINDER DRIVING MEANS AND PLATE-CYLINDER ATTACHING-DETACHING MEANS)
243 REVERSE-PRINTING-SECTION SLIT-COATER ACTUATING DEVICE
251 COATING-SECTION RUBBER-CYLINDER DRIVING-ATTACHING-DETACHING DEVICE (RUBBER-CYLINDER DRIVING MEANS AND RUBBER-CYLINDER ATTACHING-DETACHING MEANS)
252 COATING-SECTION SLIT-COATER ACTUATING DEVICE
260 INKJET ACTUATING DEVICE
270 DRYING-DEVICE ACTUATING DEVICE
284 DISCHARGING-SECTION-GRIPPER OPENING-CLOSING-CAM DRIVING DEVICE

The invention claimed is:

1. A flexible-electronic-device manufacturing apparatus for manufacturing an electronic device including a flexible base material and a plurality of functional layers provided thereon, comprising:
only one impression cylinder configured to hold and transport the base material;
adhering means allowing the base material to adhere to a surface of the only one impression cylinder;
an impression-cylinder driver that is coupled to only one impression cylinder to rotate the only one impression cylinder in forward and reverse directions;
a processor performing a plurality of processes for providing the plurality of functional layers by a printing method or a coating applying method on the base material held on the only one impression cylinder;
an impression-cylinder phase detector detecting a phase of the only one impression cylinder; and
a controller that performs the plurality of processes on the base material while rotating the only one impression cylinder in forward and reverse directions by controlling the impression-cylinder driver to rotate the only one impression cylinder in the forward and reverse directions based on a result of detection by the impression-cylinder phase detector and controlling the processor to perform the plurality of processes on the base material held on the only one impression cylinder based on the result of detection by the impression-cylinder phase detector, the controller provided with an input end to which the impression-cylinder phase detector is connected and an output end to which the impression-cylinder driver and the processor are connected.

2. The flexible-electronic-device manufacturing apparatus according to claim 1, wherein
as means for performing at least one of the plurality of processes on the base material, the processor includes
a rubber cylinder configured to be in contact with the only one impression cylinder,
a rubber-cylinder driver rotating the rubber cylinder,
a rubber-cylinder attacher-detacher attaching and detaching the rubber cylinder to and from the only one impression cylinder, and
a rubber-cylinder phase detector detecting a phase of the rubber cylinder, and
the controller controls the impression-cylinder driver, the rubber-cylinder driver, and the rubber-cylinder attacher-detacher based on results of detection by the impression-cylinder phase detector and the rubber-cylinder phase detector.

3. The flexible-electronic-device manufacturing apparatus according to claim 2, wherein
as the means for performing the at least one process, the processing means further includes
a plate cylinder configured to be in contact with the rubber cylinder,
a plate-cylinder driver rotating the plate cylinder,
a plate-cylinder attacher-detacher attaching and detaching the plate cylinder to and from the rubber cylinder, and
a plate-cylinder phase detector detecting a phase of the plate cylinder, and
the controller controls the impression-cylinder driver, the rubber-cylinder driver, the rubber-cylinder attacher-detachers, the plate-cylinder driver, and the plate-cylinder attacher-detacher based on results of detection by the impression-cylinder phase detector, the rubber-cylinder phase detector, and the plate-cylinder phase detector.

4. The flexible-electronic-device manufacturing apparatus according to claim 3, wherein
the plate cylinder is a multiple-size cylinder, and
a plurality of printing plates formed in mutually different patterns are attached to the plate cylinder.

5. The flexible-electronic-device manufacturing apparatus according to claim 1, wherein the processor includes
a printer printing a functional solution onto the base material by a printing method or a coating applying device configured to apply the functional solution onto the base material by a coating applying method, and
a solidifier solidifying the functional solution on the base material printed by the printer or applied by the coating applying device.

6. The flexible-electronic-device manufacturing apparatus according to claim 1, further comprising:
a feeder feeding the base material onto the only one impression cylinder; and
a discharger receiving the base material from the only one impression cylinder and discharging the base material, wherein
the controller controls the feeder and the discharger based on the result of detection by the impression-cylinder phase detector.

7. The flexible-electronic-device manufacturing apparatus according to claim 1, further comprising:
a base-material feeding unit configured to feed the base material onto the only one impression cylinder and including
a placing board on which to place the base material,
a sucker sucking the base material onto the placing board,
a position adjuster adjusting a position of the placing board, and
a position detector detecting a position of the base material placed on the placing board, wherein
the controller controls the position adjuster based on a result of detection by the position detector such that the base material is fed at a predetermined position onto the only one impression cylinder.

8. The flexible-electronic-device manufacturing apparatus according to claim 1, wherein
in execution of each of the plurality of processes on the base material, the controller selects any one of forward rotation and reverse rotation of the only one impression cylinder, which brings about the shortest path to a predetermined phase to start the process, and controls the impression-cylinder driver in accordance with the selection.

9. The flexible-electronic-device manufacturing apparatus according to claim 1, wherein
the controller controls the processor such that the processor performs at least one of the plurality of processes on the base material, while controlling the impression-cylinder driver such that the impression-cylinder driver rotates the only one impression cylinder in the forward and reverse directions.

\* \* \* \* \*